United States Patent
Dinh et al.

(10) Patent No.: US 9,946,279 B1
(45) Date of Patent: Apr. 17, 2018

(54) PROGRAMMABLE VOLTAGE SETTING WITH OPEN AND SHORT CIRCUIT PROTECTION

(71) Applicant: Active-Semi, Inc., Tortola (VG)

(72) Inventors: Khanh Q. Dinh, Hung Yen Province (VN); Tung V. Nguyen, Nam Dinh Province (VN); Hiroshi Watanabe, Tokyo (JP)

(73) Assignee: Active-Semi, Inc. (VG)

(*) Notice: Subject to any disclaimer, the term of this patent is extended or adjusted under 35 U.S.C. 154(b) by 0 days.

(21) Appl. No.: 15/466,681

(22) Filed: Mar. 22, 2017

Related U.S. Application Data

(60) Provisional application No. 62/354,738, filed on Jun. 25, 2016.

(51) Int. Cl.
   *G05F 1/56* (2006.01)
   *H02M 1/32* (2007.01)
   *H03K 5/08* (2006.01)
   *H02M 3/04* (2006.01)

(52) U.S. Cl.
   CPC .......... *G05F 1/56* (2013.01); *H02M 1/32* (2013.01); *H02M 3/04* (2013.01); *H03K 5/08* (2013.01)

(58) Field of Classification Search
   CPC combination set(s) only.
   See application file for complete search history.

(56) References Cited

U.S. PATENT DOCUMENTS

| | | | | |
|---|---|---|---|---|
| 5,955,914 A | * | 9/1999 | Su ............................ | G05F 1/465 327/536 |
| 7,450,354 B2 | * | 11/2008 | Tain ......................... | G05F 1/575 361/111 |

* cited by examiner

*Primary Examiner* — An Luu
(74) *Attorney, Agent, or Firm* — Imperium Patent Works; T. Lester Wallace

(57) ABSTRACT

An integrated circuit includes a voltage set input terminal, a current source, a voltage clipping circuit, and a voltage regulator. The clipping circuit receives a voltage from the terminal and supplies a voltage onto a reference voltage input of the regulator. The magnitude of an output voltage VOUT output by the regulator is the voltage on reference voltage input multiplied by the voltage gain of the regulator. The user sets VOUT by attaching an external resistor to the terminal. Current from the current source flows out of the terminal, and through the external resistor, thereby setting the voltage on the terminal. If the voltage on the terminal is between V1 and V2, then VOUT is a fixed multiple of the voltage. If the voltage is less than V1, then VOUT is a predetermined VOUTMIN value. If the voltage is greater than V2, then VOUT is a predetermined VOUTMAX value.

24 Claims, 16 Drawing Sheets

COMPARE-AND-MASK CIRCUIT

DAC AND COMPARE CIRCUIT

STATE DIAGRAM FOR THE CAPACITOR HEALTH
MONITOR STATE MACHINE

| TSET[3:0] | MILLISECONDS |
|---|---|
| 0000 | 2 |
| 0001 | 4 |
| 0010 | 8 |
| 0011 | 16 |
| 0100 | 32 |
| 0101 | 64 |
| 0110 | 128 |
| 0111 | 256 |
| 1000 | 384 |
| 1001 | 512 |
| 1010 | 640 |
| 1011 | 768 |
| 1100 | 896 |
| 1101 | 1024 |
| 1110 | 1152 |
| 1111 | 1280 |

TSET LOOKUP TABLE

CAPACITOR HEALTH CHECK

VOLTAGE REFERENCE CIRCUIT

I2C INTERFACE AND DIGITAL REGISTER CONTROL AND DIGITAL STATE MACHINE

ANOTHER EXAMPLE OF THE VOLTAGE CLIPPING CIRCUIT

CURRENT SENSE CIRCUIT

US 9,946,279 B1

PROGRAMMABLE VOLTAGE SETTING WITH OPEN AND SHORT CIRCUIT PROTECTION

CROSS-REFERENCE TO RELATED APPLICATION

This application claims the benefit under 35 U.S.C. § 119 of provisional application Ser. No. 62/354,738, entitled "Programmable Voltage Setting With Open And Short Circuit Protection", filed Jun. 25, 2016. The entirety of provisional application Ser. No. 62/354,738 is incorporated herein by reference.

TECHNICAL FIELD

The present disclosure relates generally to voltage regulator integrated circuits, to related circuits and methods.

BACKGROUND INFORMATION

FIG. 1 (Prior Art) is a diagram of a circuit involving a type of general purpose integrated circuit, a voltage regulator integrated circuit 1. The voltage regulator integrated circuit 1 outputs a regulated DC (Direct Current) output voltage VOUT onto a load 2. The voltage regulator integrated circuit 1 includes three terminals 3-5, a current source 6 and a voltage regulator circuit 7. The voltage regulator circuit 7 may be a linear regulator. The voltage regulator circuit 7 may be a switched-mode power supply (SMPS). In either case, there is an output node and conductor 8 onto which the overall regulator circuit drives the output voltage VOUT. The magnitude of VOUT on node and conductor 8 is directly related to the magnitude of a reference voltage VR on a high input impedance input 9 of the voltage regulator circuit 7. The user of the voltage regulator integrated circuit 1 can set the magnitude of VOUT by proper selection of the resistance of an external resistor 10 coupled to the VR terminal 3. If the resistance of the external resistor 10 is small, then the voltage drop across the external resistor 10 due to current flow from the current source 6 is small, and the reference voltage VR is small, and therefore the magnitude of VOUT is small. If the resistance of the external resistor 10 is large, then the voltage drop across the external resistor 10 due to current flow from the current source 6 is large, and the reference voltage VR is large, and the magnitude of VOUT is large. In this way, the user can set the magnitude of VOUT to the value desired.

SUMMARY

An integrated circuit includes a voltage set input terminal, a current source, a voltage clipping circuit, and a reference voltage input of a voltage regulator circuit. The voltage regulator circuit may be entirely disposed on the integrated circuit. Alternatively, the voltage regulator circuit may involve some circuitry on the integrated circuit as well as other electronic components disposed external to the integrated circuit. The voltage regulator circuit operates such that a regulated DC output voltage VOUT is present on an output of the voltage regulator circuit. The magnitude of this output voltage VOUT is set by a reference voltage present on the reference voltage input of the voltage regulator circuit.

In one example, provided that the reference voltage is in a particular voltage range, the output voltage VOUT is a gained-up version of the reference voltage. The magnitude of the output voltage VOUT is given by the reference voltage multiplied by the fixed positive voltage gain of the voltage regulator circuit. The fixed positive voltage gain may, for example, be positive twenty.

The current source is coupled to the voltage set input terminal such that a current sourced from the current source can flow out of the integrated circuit via the voltage set input terminal and through an external resistor to an external ground node. The user of the integrated circuit provides the external resistor of an appropriate resistance in order to set the magnitude of the output voltage VOUT. The external resistor is coupled between the voltage set input terminal and an external ground conductor and node. The voltage drop across the external resistor sets the magnitude of the set voltage on the voltage set input terminal, and the set voltage on the voltage set input terminal in turn sets the magnitude of VOUT.

An input of the voltage clipping circuit is coupled to the voltage set input terminal. An output of the voltage clipping circuit is coupled to the reference voltage input of the voltage regulator circuit. If the voltage on the voltage set input terminal is between a first predetermined limit voltage V1 and a second predetermined limit voltage V2, then the voltage on the input of the voltage clipping circuit is supplied through the voltage clipping circuit and onto the output of the voltage clipping circuit. If, however, the voltage on the voltage set input terminal is lower than the first predetermined limit voltage V1, then the voltage clipping circuit supplies the first predetermined limit voltage V1 onto the output of the voltage clipping circuit. If, however, the voltage on the voltage set input terminal is higher than the second predetermined limit voltage V2, then the voltage clipping circuit supplies the second predetermined limit voltage V2 onto the output of the voltage clipping circuit.

Advantageously, if the user's external resistor were to become disconnected from the integrated circuit for some reason, the voltage on the voltage set input terminal may rise to a voltage greater than the second predetermined limit voltage V2. Nonetheless, due to the operation of the voltage clipping circuit, the output voltage VOUT is limited and cannot exceed a VOUTMAX value. The VOUTMAX value in one example is the second predetermined limit voltage V2 multiplied by the positive voltage gain of the voltage regulator.

Advantageously, if the voltage set input terminal were for some reason to be shorted to ground external to the integrated circuit, then the voltage on the voltage set input terminal may be at a voltage lower than the first predetermined limit voltage V1. Nonetheless, due to the operation of the voltage clipping circuit, the output voltage VOUT is limited and be below a VOUTMIN value. The VOUTMIN value in one example is the first predetermined limit voltage V1 multiplied by the positive voltage gain of the voltage regulator.

Limiting the range of the output voltage VOUT in this way between VOUTMIN and VOUTMAX may protect circuitry from failure and/or faulty operation due to an overvoltage or an undervoltage condition. The circuitry protected may be circuitry of the integrated circuit and/or may be circuitry external to the integrated circuit.

The user, rather than using an external resistor to set the magnitude of VOUT, can use another driver circuit external to the integrated circuit to control and/or to set the voltage on the voltage set input terminal. In some embodiments, the current source does not source current so that current flows out of the voltage set input terminal, but rather the current source sinks current so that current flows into the integrated circuit via the voltage set input terminal. In the case of the current source sinking a current, the external resistor is coupled between an external supply voltage node and conductor and the voltage set input terminal.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 6 is a larger diagram formed by FIG. 6A and FIG. 6B.

DETAILED DESCRIPTION

Figure 1:
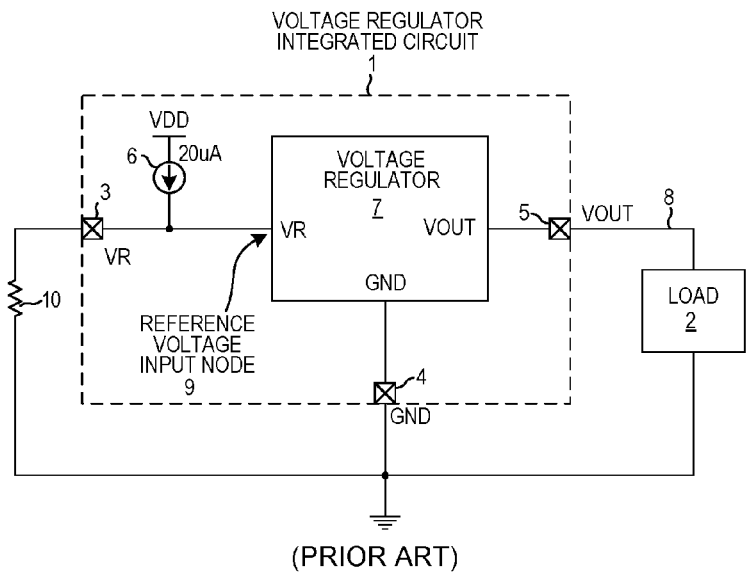
FIG. 1 (Prior Art) is a diagram of a system involving a prior art voltage regulator integrated circuit.
Figure 2:
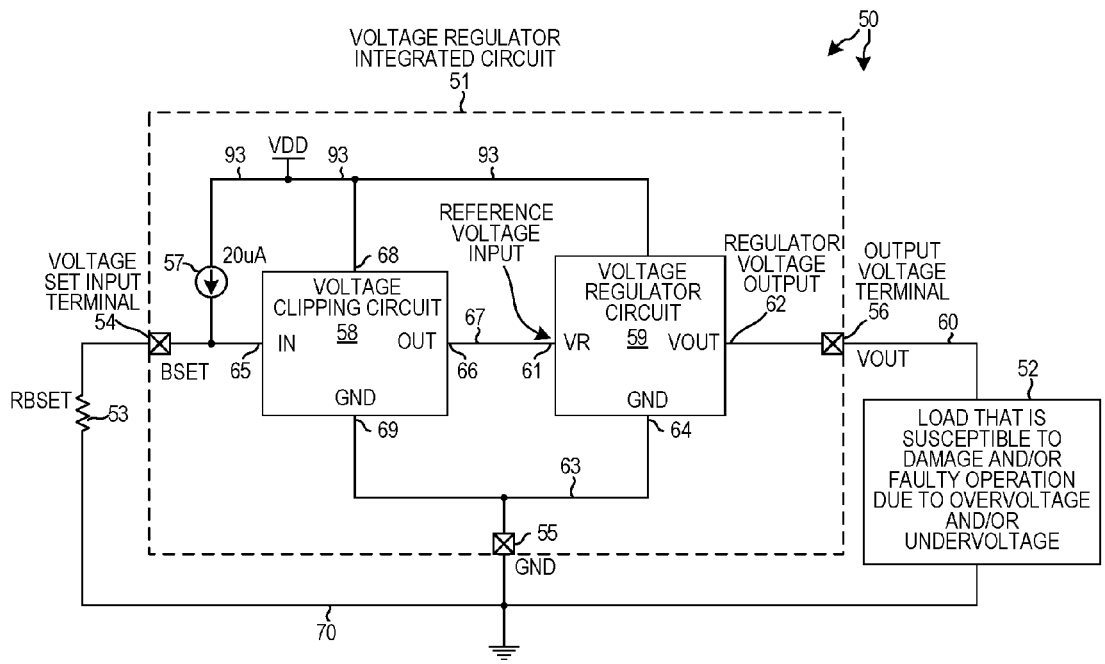
FIG. 2 is a diagram of a system involving a novel voltage regulator integrated circuit in accordance with one novel aspect.

FIG. 2 is a diagram of a system 50 that involves a novel voltage regulator integrated circuit 51, a load 52, and an external resistor RBSET 53. Voltage regulator integrated circuit 51 includes a voltage set input terminal BSET 54, a ground terminal GND 55, an output voltage terminal VOUT 56, a current source 57, a voltage clipping circuit 58, and a voltage regulator circuit 59. The voltage regulator circuit 59 may be a linear regulator. The voltage regulator circuit 59 may be a switched-mode power supply (SMPS). The voltage regulator circuit 59 can also be part of a larger voltage regulator, where the larger overall voltage regulator includes the circuit 59 on the integrated circuit 51 and also includes one or more electrical components external to the integrated circuit. For example, in one example the overall larger voltage regulator is a switched-mode power supply. Various magnetic components and storage capacitors of the overall larger voltage regulator are disposed outside the integrated circuit 51, but these external components are coupled to the voltage regulator circuit 59 of the integrated circuit. Together the voltage regulator circuit 59 and the external electrical components make up the overall larger voltage regulator that supplies the regulated output voltage VOUT onto the VOUT terminal 56.

In the example illustrated in FIG. 2, the voltage regulator circuit 59 causes a regulated DC output voltage VOUT to be driven onto a conductor 60, where the magnitude of VOUT is directly related to the voltage magnitude of a reference voltage VR present on an input 61 of the voltage regulator circuit 59. The voltage regulator circuit 59 outputs the output voltage VOUT from its regulator voltage output 62. The regulator voltage output 62, the VOUT terminal 56, and the conductor 60 are actually the same electrical node. The reference voltage VR and the output voltage VOUT are relative to a ground potential present on the ground terminal 55, ground conductor 63, ground input 64, and ground input 69. The terminal 55, conductor 63, GND input 69, and GND input 64 are parts of the same overall ground node.

The user of the voltage regulator integrated circuit 51 can set the magnitude of VOUT by proper selection of the resistance of the external resistor RBSET 53. If the resistance of the external resistor RBSET 53 is small, then the voltage drop across the external resistor due to current flow from the current source 57 is commensurately small, and the voltage on the BSET terminal 54 is small, and the reference voltage on the VR input 61 is small, and therefore the magnitude of VOUT is small. If, on the other hand, the resistance of the external resistor RBSET 53 is large, then the voltage drop across the external resistor due to current flow from the current source 57 is commensurately large, and the voltage on the BSET terminal 54 is large, and the reference voltage on the VR input 61 is large, and therefore the magnitude of VOUT is large. Provided that the voltage on the BSET terminal 54 is not below a first predetermined limit voltage V1, and is not above a second predetermined limit voltage V2, then the voltage on the BSET terminal 54 is passed through the voltage clipping circuit 58 and is supplied onto the VR input 61 of the voltage regulator circuit 59. The voltage clipping circuit 58 receives the voltage on its input 65 from terminal BSET and outputs the voltage onto its output 66. The voltage on the voltage clipping circuit's output 66 is communicated via conductor 67 onto the VR input 61 of the voltage regulator circuit 59. The voltage clipping circuit is powered by a supply voltage VDD. The supply voltage VDD is received from a supply voltage conductor 93 via a VDD input 68. The magnitude of the supply voltage VDD on the VDD input 68 is relative to ground potential on the GND input 69. Both the voltage clipping circuit 58 and the current source 57 are powered by the supply voltage VDD received from the supply voltage conductor 93.

In a first application involving a first type of load, the supply voltage VDD is 3.3 volts DC, and the output voltage VOUT is a substantially higher voltage such as 36 volts DC. In a second application involving a second type of load, the supply voltage VDD is 3.3 volts DC but the output voltage VOUT is another substantially higher voltage such as 30 volts DC. The voltage regulator circuit 59 is a type of power supply circuit that can drive the voltage VOUT on terminal 56 to such a high voltage that the load 52 could be damaged. For example, the voltage regulator circuit 59 might be able to drive the output voltage VOUT on terminal 56 to a regulated value of 40 volts, but this high voltage would then damage the both the first and second types of load.

Also, the overall circuit in which the system 50 operates might be such that the voltage VOUT should never be below another DC voltage. For example, in the first application it may be known that the output voltage VOUT should never be lower than 10 volts DC. In the second application, it may be known that the output voltage VOUT should never be lower than 5 volts DC.

If the voltage clipping circuit 58 were not present, and if the external RB SET resistor 53 were to fail for some reason such that the voltage set input terminal BSET 54 were not coupled through any external resistance to the ground conductor 70, then the current source 57 would operate to pull the voltage on the voltage set input terminal BSET 54 up to a high voltage. This high voltage might be as high as the supply voltage VDD. This high voltage on the voltage set input terminal BSET 54 would be communicated onto the VR input 61 of the voltage regulator circuit 59, and this in turn would cause the magnitude of the output voltage VOUT to exceed 36 volts DC. The output voltage VOUT may, for example, be set to its maximum value of 40 volts DC. This high voltage may damage the load 52.

If, on the other hand, the BSET terminal 54 were for some reason to become shorted to ground conductor 70 such that ground potential were present on the BSET terminal 54, then ground potential from the terminal BSET 54 would be supplied onto the VR input 61 of the voltage regulator circuit 59, and this in turn would cause the magnitude of the output voltage VOUT to be zero volts. Zero volts is lower than 5 volts DC, so the low voltage on conductor 60 may damage the load, or otherwise cause unwanted operation and/or failures of the overall system of which the system 50 is a part.

In accordance with one novel aspect, if the voltage on the BSET terminal 54 is below the first predetermined limit voltage V1, then the voltage clipping circuit 58 outputs a voltage onto the VR input 61 of the voltage regulator circuit 59 such that the magnitude of the output voltage VOUT on terminal 56 is a minimum limit voltage value VOUTMIN. In the present example, this VOUTMIN minimum limit voltage value is the smaller of 5 volts DC and 10 volts DC, so the VOUTMIN minimum limit voltage is 5 volts DC. Depending on the value of RBSET, the voltage regulator integrated circuit 51 can be made to output an output voltage VOUT as low as 5 volts DC. If, however, the voltage on the BSET terminal 54 is above the second predetermined limit voltage V2, then the voltage clipping circuit 58 outputs a voltage onto the VR input 61 of the voltage regulator circuit 59 such that the magnitude of the output voltage VOUT is a maximum limit voltage value VOUTMAX. In the present example, this maximum limit voltage value VOUTMAX is the larger of 30 volts DC and 36 volts DC, so the maximum limit voltage is 36 volts DC. Depending on the value of RBSET, the voltage regulator integrated circuit 51 can be made to output an output voltage VOUT as high as 36 volts. If the voltage on the BSET terminal 54 is between V1 and V2, then the magnitude of the output voltage VOUT on terminal 56 is directly proportional to the magnitude of the voltage on the BSET terminal 54, and this voltage is a user presettable voltage between VOUTMIN and VOUTMAX. By appropriate selection of the resistance of the external resistor 53, the user of the voltage regulator integrated circuit 51 can set the output voltage VOUT anywhere in the voltage range from VOUTMIN to VOUTMAX, but the output voltage VOUT cannot exceed 36 volts DC, and cannot be below 10 volts DC. Making sure that the output voltage VOUT is in this VOUTMIN to VOUTMAX range protects the load 52 from damage and/or faulty operation due to an overvoltage or undervoltage condition.

The voltage gain of the voltage regulator circuit 59 is twenty. Therefore the first predetermined voltage V1 is 0.5 volts, and the second predetermined voltage V2 is 1.8 volts. An external resistance RBSET value of 25 kΩ will result in the first predetermined voltage V1 of 0.5 volts being present on the BSET terminal 54, and due to the voltage gain of twenty of the voltage regulator circuit 59 the output voltage VOUT will have a magnitude of 10 volts DC. An external resistance RBSET value of 90 kΩ will result in the second predetermined voltage V2 of 1.8 volts being present on the BSET terminal 54, and due to the voltage gain of twenty of the voltage regulator circuit 59 the output voltage VOUT will have a magnitude of 36 volts DC. Accordingly, the user can set the output voltage VOUT to be anywhere in the range of from 10 volts DC to 36 volts DC by selecting an appropriate RBSET resistance value in the range of from 25 kΩ to 90 kΩ.

Figure 3:
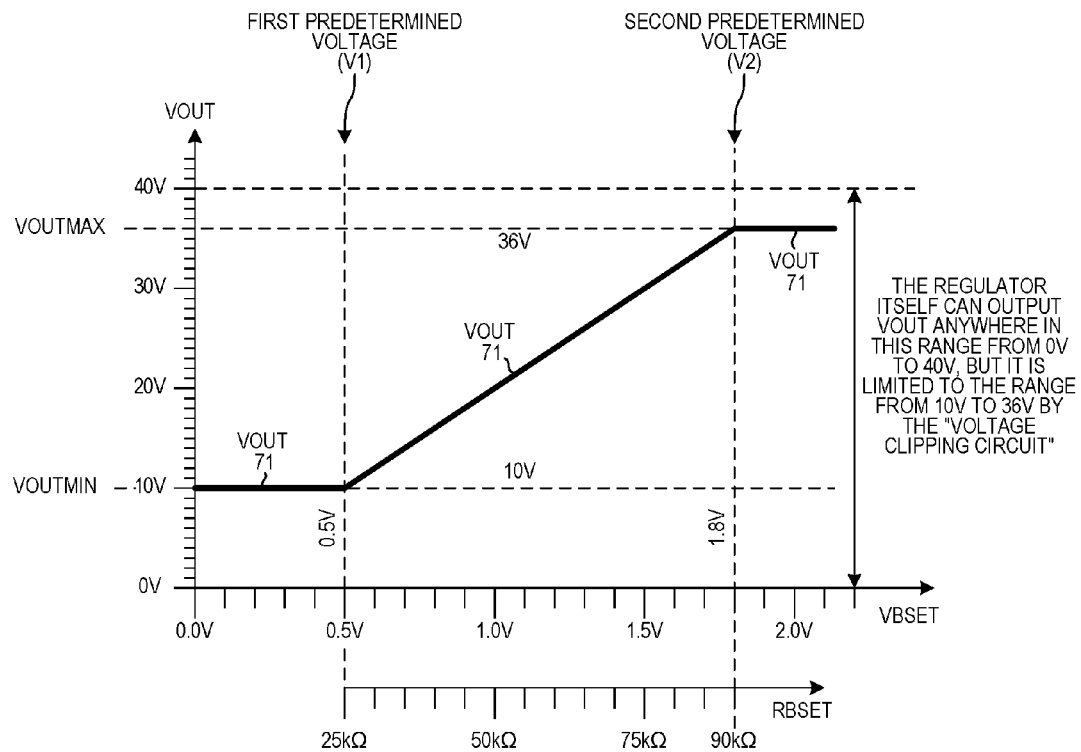
FIG. 3 is a diagram that shows the relationship between the voltage on the BSET terminal and the voltage on the output voltage terminal VOUT.

FIG. 3 is a diagram that shows the relationship between the voltage on the BSET terminal 54 and the output voltage VOUT. The output voltage VOUT can be set anywhere in the range of from the VOUTMIN value of 10 volts to the VOUTMAX value of 36 volts. The value of external resistor RBSET 53 that should be used in order to set a particular desired output voltage VOUT is given below on the horizontal line labeled RBSET.

Figure 4:
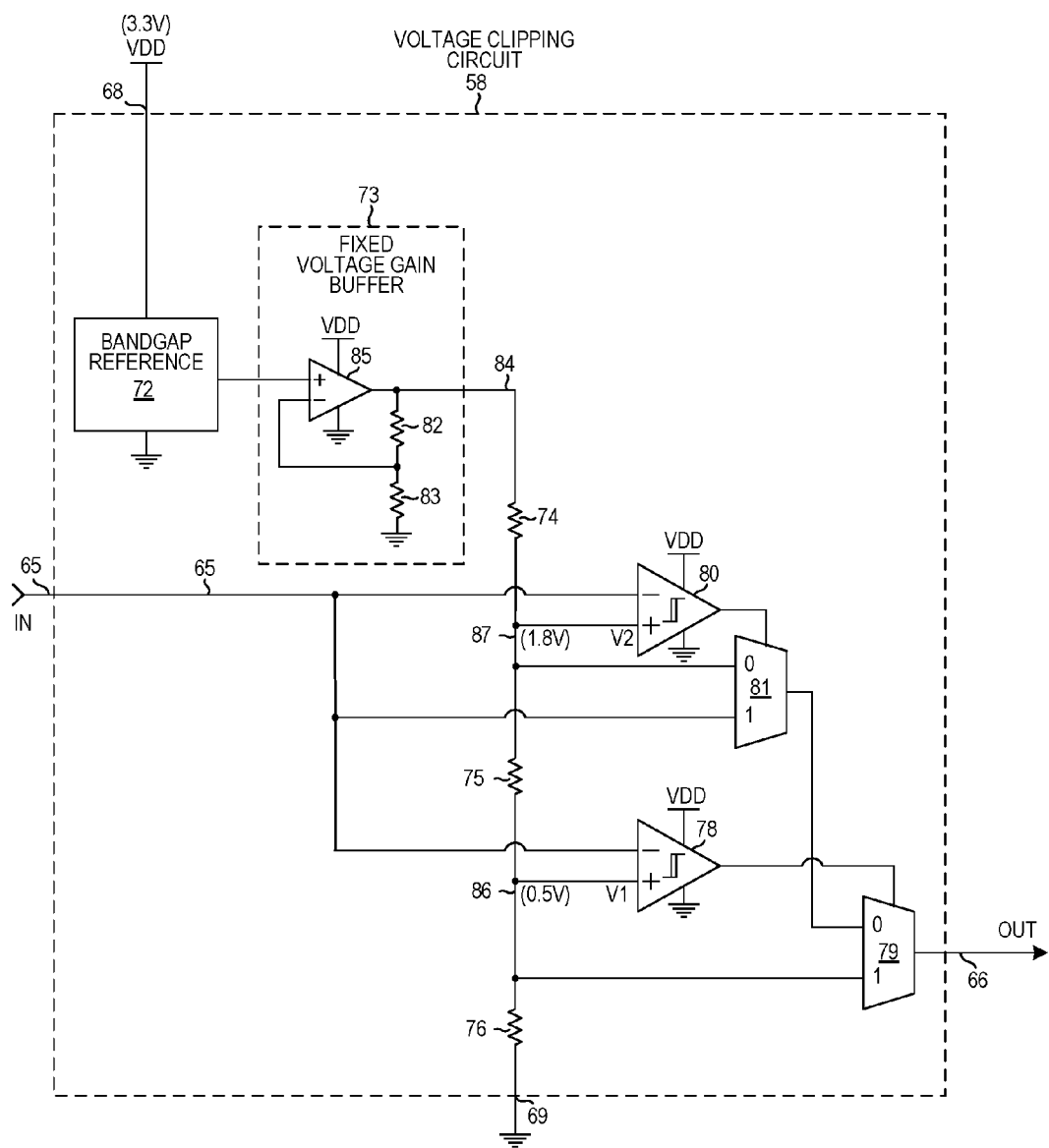
FIG. 4 is a circuit diagram of one example of the voltage clipping circuit 58 of FIG. 2.

FIG. 4 is a circuit diagram of one example of the voltage clipping circuit 58 of FIG. 2. This specific circuit includes a bandgap reference circuit 72, a fixed voltage gain buffer circuit 73, a resistor string consisting of resistors 74, 75 and 76, a first comparator with 40 mV of hysteresis 78, a first two-to-one analog multiplexer 79, a second comparator with 40 mV of hysteresis 80, and a second two-to-one analog multiplexer 81.

The resistances of resistors 82 and 83 are such that the voltage gain of the fixed voltage gain buffer circuit 73 is appropriately high that the voltage on node 84 is at a voltage somewhat higher than the desired second predetermined limit voltage V2. This voltage on node 84 is a fixed voltage because the bandgap voltage is a fixed voltage and because the voltage gain of circuit 73 is fixed. Reference numeral 85 identifies an operational amplifier of the fixed voltage gain buffer circuit 73. For the fixed voltage on node 84, the resistances of the resistors 74-76 are chosen so that the first predetermined limit voltage V1 (0.5 volts in this example) is present on node 86, and so that the second predetermined limit voltage V2 (1.8 volts in this example) is present on node 87.

If the voltage on the IN input 65 is below the first predetermined voltage V1, then the first comparator 78 outputs a digital logic high level digital signal. This digital logic high signal is supplied onto the select input lead of analog multiplexer 79. The analog multiplexer 79 therefore couples the node 86 and its "1" input lead to the output lead of the multiplexer. The output lead of the multiplexer 79 is coupled to the output node 66 OUT. Accordingly, for input voltages on the IN input 65 that are lower than the first predetermined limit voltage V1, the overall circuit of FIG. 4 outputs the first predetermined voltage value V1 onto the OUT output node 66.

If, however, the voltage on the IN input 65 is higher than the second predetermined limit voltage V2, then the second comparator 80 outputs a digital logic low digital signal. This causes multiplexer 81 to couple the node 87 and its "0" input lead to the output lead of the multiplexer 81. The output lead of the multiplexer 81 is in turn coupled to the "0" input lead of the multiplexer 79. Because the voltage on the IN input 65 is higher than the first predetermined voltage value of V1, the comparator 78 is outputting a digital logic low signal onto the select input of multiplexer 79. Multiplexer 79 therefore couples its "0" input lead to its output lead. Accordingly, the second predetermined limit voltage V2 is coupled from node 87, through multiplexer 81, and through multiplexer 79, and onto the OUT output node 66.

The third possibility for the input voltage on the IN input 65 is that it is neither lower than the first predetermined limit voltage V1 nor is it higher than the second predetermined limit voltage V2. If the input voltage on the IN input 65 is in this range, then comparator 80 is outputting a digital logic high signal and comparator 78 is outputting a digital logic low signal. As a result, the voltage on the input conductor and node 65 is coupled through multiplexer 81 and through multiplexer 79 onto the OUT output node 66.

Figure 5:
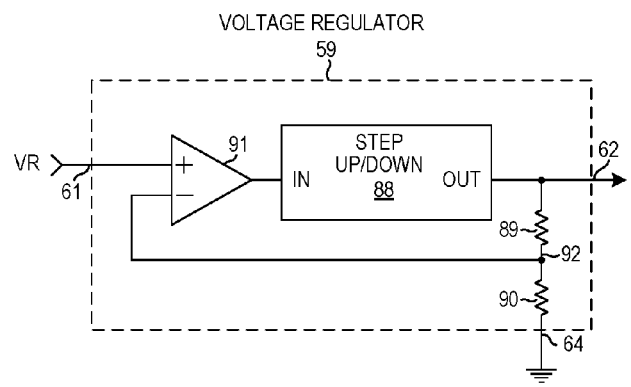
FIG. 5 is a diagram of one example of the voltage regulator circuit of FIG. 2.

FIG. 5 is a diagram of one example of the voltage regulator circuit 59 of FIG. 2. In the case of the voltage regulator 59 of FIG. 2 having a voltage gain of positive twenty, and the supply voltage VDD being 3.3 volts, the step up/down circuit 88 is a step up circuit that has a fixed positive gain. A scaled down version of the voltage VOUT on the regulator voltage output 62 is created by a voltage divider involving resistors 89 and 90. This scaled down voltage on center tap 92 of the voltage divider is supplied back onto the non-inverting input lead of differential amplifier 91. The feedback loop of the circuit operates to keep the voltage difference between the two input leads of the differential amplifier 91 as close to zero volts as possible. As a result, the output voltage on regulator voltage output 62 is a voltage that is a settable positive multiple of the input voltage VR input 61, where the settable positive multiple is determined by the resistance values of the resistors 89 and 90.

Figure 6A:
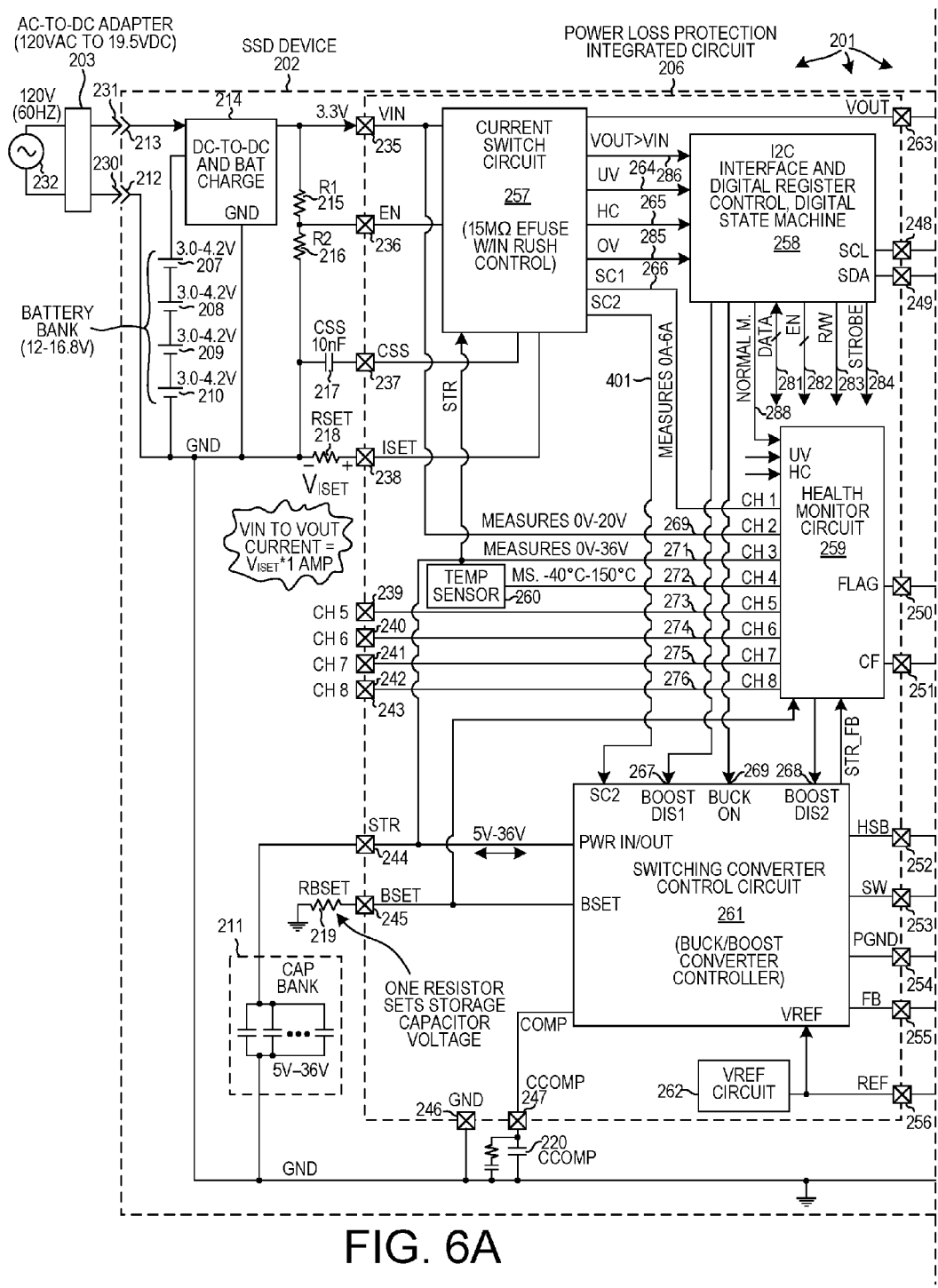
FIG. 6A is a first part of a larger diagram of a system involving a novel power loss protection integrated circuit.
Figure 6B:
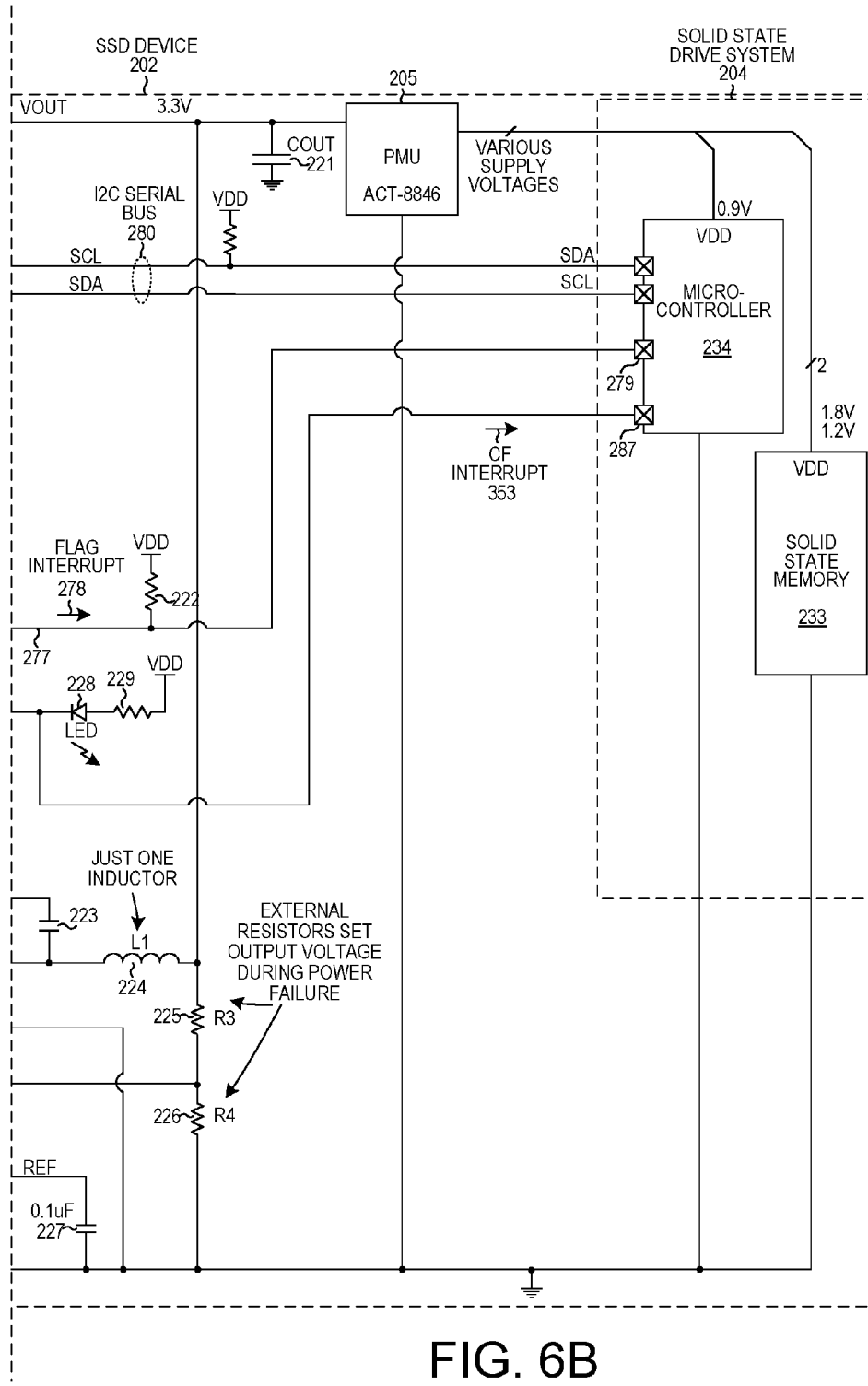
FIG. 6B is a second part of a larger diagram of a system involving a novel power loss protection integrated circuit.

FIG. 6A and FIG. 6B together form a larger diagram, FIG. 6.

FIG. 6 illustrates a system 201 that involves a device to be powered 202, and an AC-to-DC adapter 203. The device 202 in this particular example is a Solid State Drive (SSD) device. It includes a solid state drive system 204, a Power Management Unit (PMU) integrated circuit 205, a power loss protection integrated circuit 206, a bank of series-connected batteries 207-210, a bank of parallel-connected capacitors 211, a socket portion 212 and 213 of a connector, a DC-to-DC converter and battery charger 214, and other discrete components 215-229. The solid state drive system 204 includes, among other components not shown, a solid state memory portion 233 and a microcontroller integrated circuit 234. The AC-to-DC adapter 203 can be connected to the SSD device 202 by plugging its plug portion 230 and 231 into the socket portion 212 and 213 of the SSD device, and the AC-to-DC adapter 203 can be disconnected from the SSD device 202 by unplugging it from the socket portion. The AC-to-DC adapter 203 is coupled to receive power from a 120 volt RMS VAC 60 Hz supply voltage source 232 such as, for example, a standard residential wall socket. The SSD device 202 further includes a printed circuit board (not shown) disposed within an enclosure (not shown). The integrated circuits and other components of the SSD device 202 are mounted to the PCB and are contained in the enclosure.

Power loss protection integrated circuit 206 includes a VIN terminal 235, an EN terminal 236, a CSS terminal 237, an ISET terminal 238, several analog input terminals 239-243, a STR terminal 244, a voltage set input terminal BSET 245, a ground terminal GND 246, a CCOMP terminal 247, a VOUT terminal 263, an SCL terminal 248, a SDA terminal 249, a flag output terminal 250, a capacitor flat terminal CF 251, an HSB terminal 252, a SW terminal 253, a PGND terminal 254, an FB terminal 255, a REF terminal 256, a current switch circuit 257, an I2C interface and digital register control and digital state machine circuit 258, a health monitor circuit 259, an on-chip temperature sensor 260, a buck/boost switching converter control circuit 261, and a reference voltage circuit 262. The "terminals" mentioned above are integrated circuit terminals such as either bond pads of an integrated circuit chip or package terminals of an integrated circuit package that houses the actual integrated circuit chip.

The current switch circuit 257 is also called an eFuse circuit. The current switch circuit 257 can couple the VIN terminal 235 to the VOUT terminal 263 such that current can freely flow from the VIN terminal 235, through the current switch circuit 257, and to the VOUT terminal 263. When the current switch circuit 257 is ON in this way, it only introduces a 15 milliohm resistance in that current path. The current switch circuit 257 monitors the voltage on the VIN terminal. If the voltage on the VOUT terminal 263 is greater than the voltage on the VIN terminal 235, then the switch circuit 257 asserts the VOUT>VIN digital signal on conductor 286 to a digital logic high, otherwise the VOUT>VIN digital signal is a digital logic low. If the voltage on the VIN terminal is below an undervoltage value set by resistors 215 and 216, then the current switch circuit 257 is OFF such that the VIN terminal is not coupled to the VOUT terminal through the switch circuit 257. If the current switch circuit 257 detects the "UV" undervoltage condition, then it asserts the UV digital signal on conductor 264 to a digital logic high, otherwise the UV digital signal is a digital logic low. If the voltage on the VIN terminal is above a programmable overvoltage value, then the current switch circuit 257 is OFF such that the VIN terminal is not coupled to the VOUT terminal through the switch circuit 257. If the current switch 257 detects the "OV" overvoltage condition, then it asserts the OV digital signal on the OV conductor 285.

In addition to sensing voltages, the current switch circuit 257 also senses the magnitude of current flowing through the current switch between the VIN terminal and the VOUT terminal. If the current is below a predetermined high current value ($A_{HC}$), and if the current switch 257 is to be ON as determined by the voltage on the VIN terminal, then the current switch is fully ON (to have a resistance of 15 milliohms or less). If, however, the current is detected to reach the high current value ($A_{HC}$), then the current switch circuit begins to regulate the through-current so that the through-current remains at the high current value amount $A_{HC}$ but does not exceed $A_{HC}$. The current switch 257 does this by controlling the gate voltages on a pair of series field effect transistors through which the through-current flows. Increasing the drain-to-source resistance $R_{DS}$ of these field effect transistors allows the flow of current to be maintained at the $A_{HC}$ amount. If, however, the $R_{DS}$ across the transistors becomes too high, or if the voltage on the VOUT terminal decreases too much, then the field effect transistors are not linearly regulated by controlling their $R_{DS}$ resistances, but rather the field effect transistors are turned on and off repeatedly with a duty cycle. The duty cycle is regulated in an attempt to limit the power dropped in the current switch circuit 257. In this way, the current switch circuit 257 serves a function of limiting the magnitude of a possible large inrush current (inrush power) that might otherwise flow into the system when the SSD device is initially plugged into the AC-to-DC adapter 203 when the storage capacitors 211 are fully discharged and when the COUT capacitor 221 is fully discharged. In the present example, the inrush current limit set by the resistance of resistor RSET 218 is a current (for example, two amperes) that is larger than a typical digital logic or analog signaling input terminal or output terminal could handle.

The CSS capacitor 217 slows down the start up slew rate of the current switch circuit 257, thereby providing a "soft start" operation. The board designer can select the capacitance value of the CSS capacitor to tailor the startup slew rate as desired. If left open, the startup slew rate defaults to one millivolt per microsecond. The high current value ($A_{HC}$) is set by setting the resistance value of resistor RSET 218. The high current value $A_{HC}$ is roughly equal to one volt divided by the RSET value in ohms. If the current switch circuit 257 detects the "HC" high current condition, then it asserts the HC digital signal on conductor 265 to digital logic high, otherwise the HC digital signal is a digital logic low. The current switch circuit 257 includes a current sensor/mirror circuit 400 that provides a small auxiliary current flow whose magnitude is proportional to the magnitude of the main current flow through the current switch circuit 257 from the VIN terminal to the VOUT terminal. This small mirrored auxiliary current is converted into a voltage signal by making the current flow across the RSET resistor 218. The resulting voltage signal, whose magnitude is proportional to the current flow through the switch circuit 257, is output from the current switch circuit 257 via the switch current (SC1) conductor 266. The voltage signal SC1 on the switch current SC1 conductor 266 is indicative of the magnitude of the current flowing through the current switch 257.

In addition to voltage signal SC1, the current switch circuit 257 also outputs another signal (SC2). Signal SC2 is a current that is proportional to the current flowing through the current switch 257 from the VIN terminal to the VOUT terminal. This current signal SC2 is communicated via conductor 401 to the switching converter control circuit 261. In the switching converter control circuit 261, the current SC2 is converted into a voltage signal by running the current through a resistor 402.

The buck/boost switching converter control circuit 261, together with external components 220, 221 and 223-227 is operable as a buck switching converter or as a boost switching converter. When it is operating in a boost mode, the converter receives a relatively low voltage from the VOUT terminal, and outputs a boosted up relatively high voltage onto the STR terminal 244. In one example, the voltage on the VOUT terminal is 3.3 volts DC, and the voltage that the converter drives onto the STR terminal 244 is 36 volts DC. This relatively high voltage serves to charge the capacitor bank 211 capacitors up to 36 volts. The magnitude of this charging voltage is set by the value of the RBSET resistor 219. When the converter is operating in a buck mode, the converter receives a relatively high voltage from the STR terminal 244, and outputs a bucked down relatively low voltage onto the VOUT terminal 263. In one example, the voltage on the STR terminal 244 is 36 volts (as set by the RBSET resistor), and the voltage that the converter drives onto the VOUT terminal is 3.3 volts DC. The buck/boost switching converter control circuit 261 has an active high boost disable digital signal input lead BOOST_DIS1 267 and another active high boost disable digital input lead BOOST_DIS2 268. If a digital logic high signal is present on either of these inputs, then the converter is prevented (disabled) from operating in the boost mode. The buck/boost switching converter control circuit 261 also has an active high digital signal input lead BUCK ON 269. If a digital logic high signal is present on this input 269, then the converter is made to start operating in the buck mode.

The health monitor circuit 259 includes an eight-channel sigma-delta Analog-to-Digital Converter (ADC), a set of compare-and-mask circuits, and a digital state machine. The health monitor circuit 259 autonomously monitors the voltages on eight input conductors 266, 269, and 271-276 (8 channels). If any one of these voltages is detected to be below a corresponding lower voltage limit or is detected to be above a corresponding upper voltage limit, then this undervoltage or overvoltage condition is latched into a latch of the detecting compare-and-mask circuit, and the voltage on flag terminal 250 is pulled down to ground potential. The voltage on the open-drain flag terminal 250 is otherwise not pulled down, but rather is pulled up to the VDD supply voltage by external pullup resistor 222. The low voltage (ground potential) on flag terminal 250 and conductor 277 constitutes an interrupt signal 278. This active low interrupt signal 278 is supplied via conductor 277 onto the active low interrupt input terminal 279 of microcontroller 234. The low interrupt signal therefore interrupts the microcontroller 234. The microcontroller 234 can respond to the interrupt, as further explained below, by accessing the power loss protection integrated circuit 206 via the two-wire I2C bus 280. The two conductors SDL and SDA are the two conductors of the I2C bus. The values of the lower voltage limit and the upper voltage limit for each of the eight channels is user programmable (changeable via the microcontroller 234 under software control) via the I2C interface of terminals 248 and 249. In the present example, the measurable voltage range on conductor 266 corresponds to a measured through-current flowing through the current switch 257 in the range of from zero amperes to six amperes. In the present example, the measurable voltage range on conductor 269 corresponds to a measured voltage on the VIN terminal in the range of from zero volts to twenty volts. In the present example, the measurable voltage range on conductor 271 corresponds to a measured storage capacitor voltage on the STR terminal in the range of from zero volts to thirty-six volts. In the present example, the measurable voltage range on conductor 272 corresponds to a measured on-chip temperature in the range of from minus forty degrees Celsius to plus one hundred and fifty degrees Celsius.

The health monitor circuit 259 also includes a capacitor health check circuit 299. The capacitor health check circuit 299 includes a digital state machine. If the power loss protection integrated circuit 206 is not operating in the normal mode as indicated by the active high NORMAL_MODE digital signal on conductor 288, then the capacitor health check circuit is disabled. If, however, the power loss protection integrated circuit 206 has been operating in the normal mode for a least four minutes, at the conclusion of the four minute period the state machine disables the boost converter and enables a ten milliampere current source 350. The ten milliampere current source 350 sinks current from the STR terminal 244. At the end of a time period determined by the programmable value TSET [3:0], the state machine disables the ten milliampere current source 350 and enables a fifty milliampere current source 351 that sinks current from the STR terminal 244. The fifty milliampere current source remains enabled for a period of time determined by the value TSET[3:0]. In one example, this time period is one tenth the period of time the ten milliampere current source was enabled. If at any time during the period of time when either of the two sinking current sources is enabled the voltage on the STR terminal 244 falls below a programmable voltage, then a latch 352 is set. The programmable voltage is determined by the user programmable value THR[3:0]. The setting of the latch causes the voltage on the capacitor fault terminal CF 251 to be pulled down to ground potential. This is an indication of a capacitor fault condition. This active low fault signal 353 may, for example, be supplied onto a second interrupt input terminal 287. In addition, the LED 228 is on during the time when then capacitor fault signal is asserted low.

The I2C interface and digital register control and digital state machine circuit 258 is a digital block that includes an I2C serial bus interface circuit and a digital state machine circuit. There are various digital registers disposed in various places across the integrated circuit. The digital outputs of various ones of the bits of these registers are coupled to various circuits in the integrated circuit so that the stored digital values will control and affect operation of the circuitry. Other selected bits of the registers are used to capture the digital states of corresponding nodes in the circuitry. The I2C interface is usable to read and to write to any selected one of these registers via the DATA conductors 281, the enable conductors 282, the R/W conductor 283 and the strobe conductor 284. The DATA conductor 281, the R/W conductor 283, and the strobe conductor 284 extend to all these registers. For each register, there is one dedicated enable conductor that extends from the I2C interface logic to an enable input lead of that register.

To write an 8-bit value into a particular register, the I2C interface places the data to be written onto the DATA conductors 281. Because the access is a write, the voltage on the R/W conductor 282 is driven to a digital logic low level. The enable conductors to all the registers are driven to be disabled (digital logic low), except for the one desired register that is to be written. The enable conductor to that register is driven with a digital logic high signal. After these signals are set up, the strobe signal on conductor 284 is pulsed high to clock the data into the enabled register. The 8-bit value stored in a particular register can be read by the I2C interface in similar fashion except that the I2C interface does not drive data out on the DATA conductors, but rather the I2C is setup to read in data from the DATA conductors. In addition, the digital logic value driven onto the R/W conductor is a digital logic high value. When the data bus conductors are set up this way, a pulsing of the strobe signal causes the enabled register to output its 8-bit value onto the 8-bit DATA bus, so that the 8-bit value will then be latched into the I2C interface logic. In this way, the I2C interface can read from, and can write to, any selected one of the registers on the integrated circuit.

Figure 7:
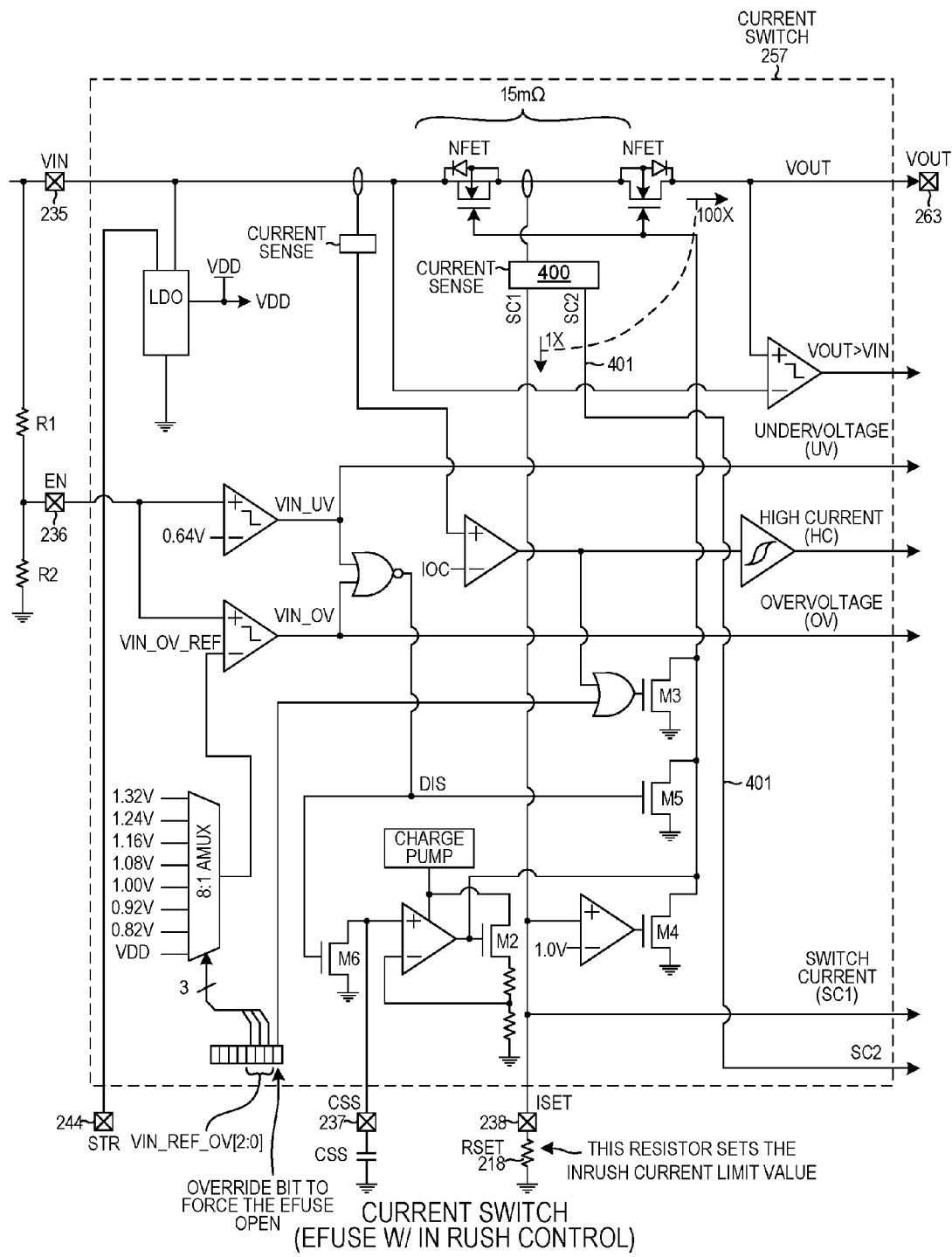
FIG. 7 is a more detailed diagram of the current switch circuit 257 of FIG. 6.

FIG. 7 is a more detailed diagram of the current switch circuit 257 of FIG. 6.

Figure 8:
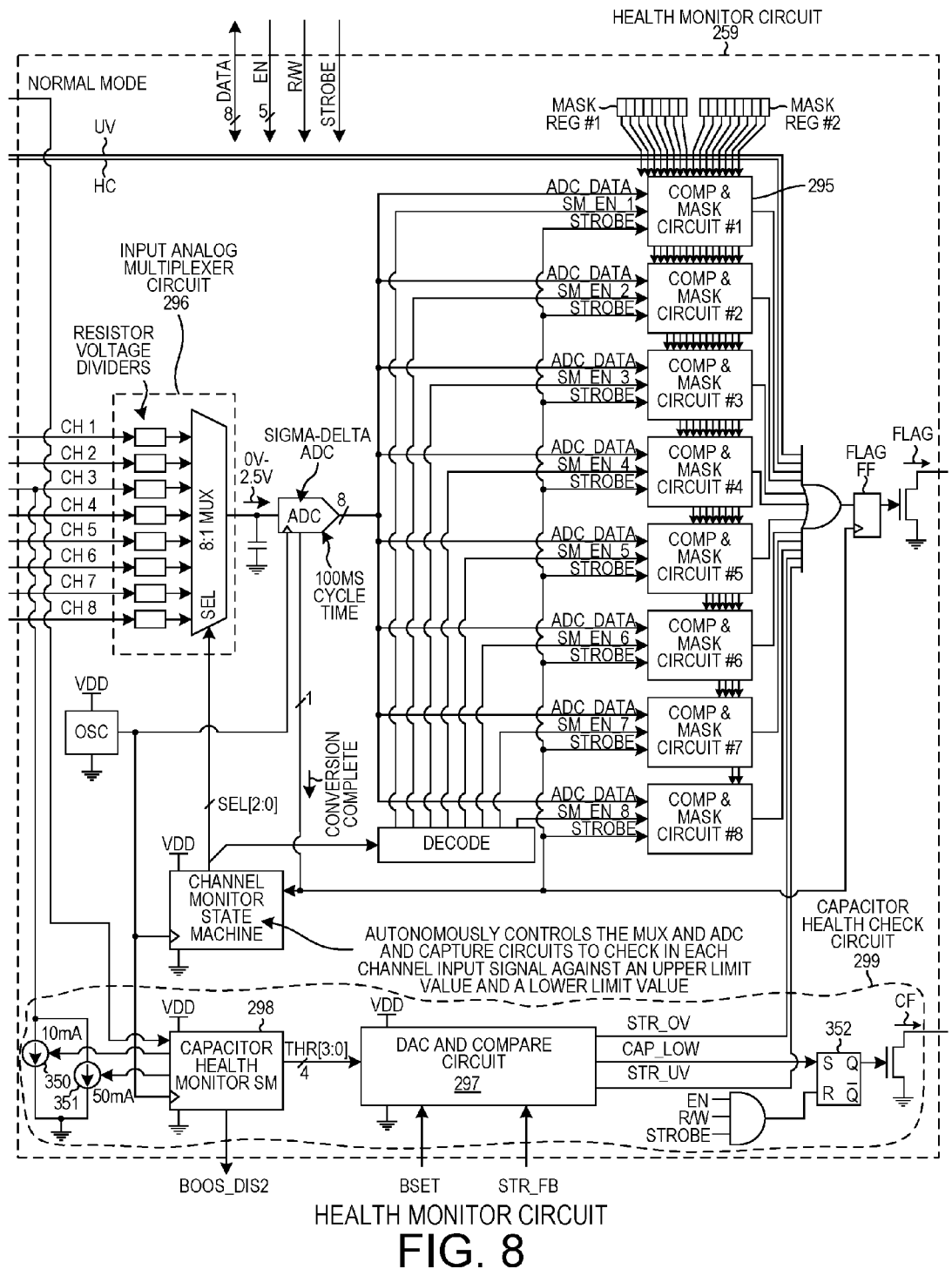
FIG. 8 is a more detailed diagram of the health monitor circuit 259 of FIG. 6.

FIG. 8 is a more detailed diagram of the health monitor circuit 259 of FIG. 6.

Figure 9:
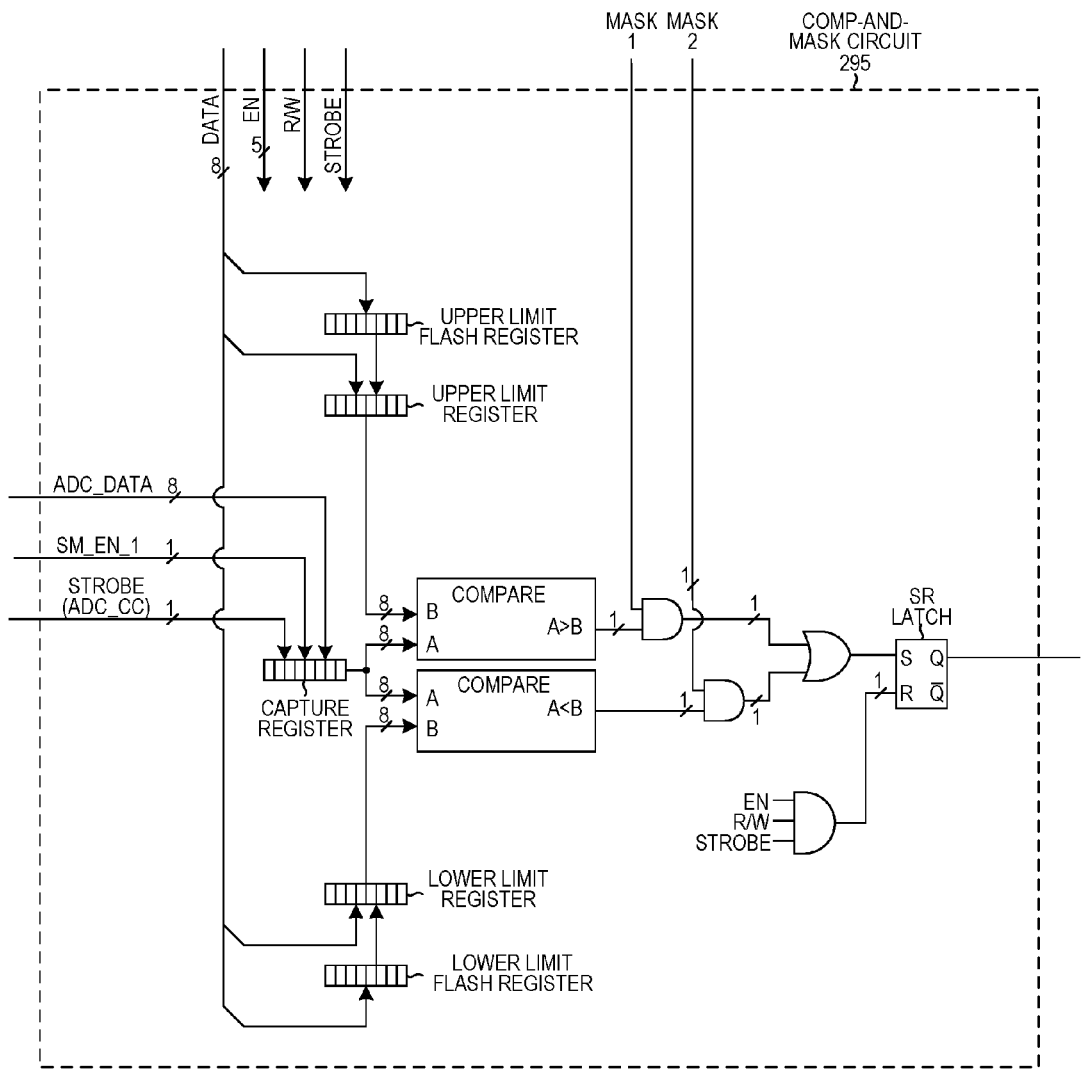
FIG. 9 is a more detailed diagram of one of the compare-and-mask circuits of FIG. 8.

FIG. 9 is a more detailed diagram of one of the compare-and-mask circuits 295 of FIG. 8.

Figure 10:
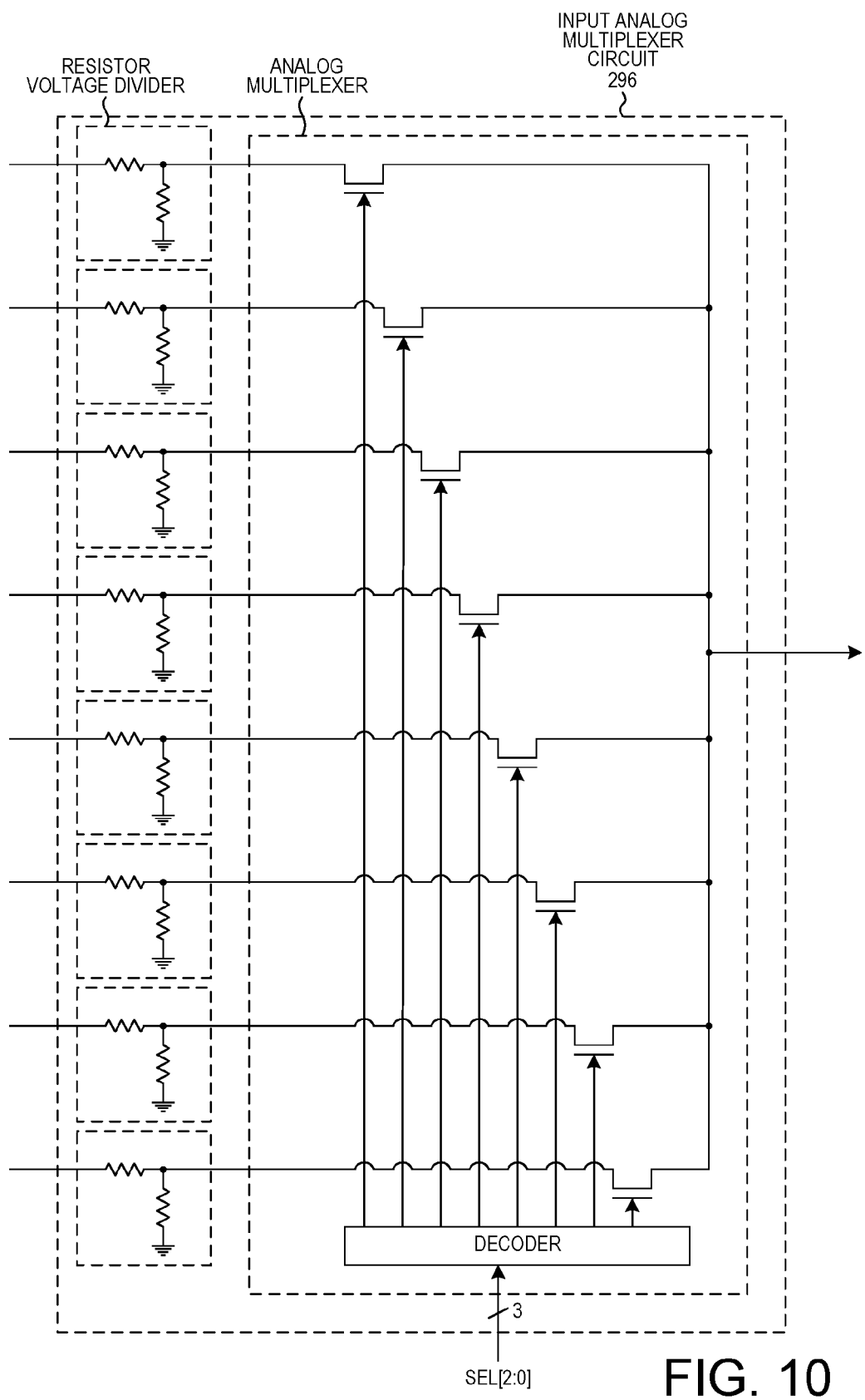
FIG. 10 is a more detailed diagram of the input analog multiplexer circuit of FIG. 8.

FIG. 10 is a more detailed diagram of the input analog multiplexer circuit 296 of FIG. 8.

Figure 11:
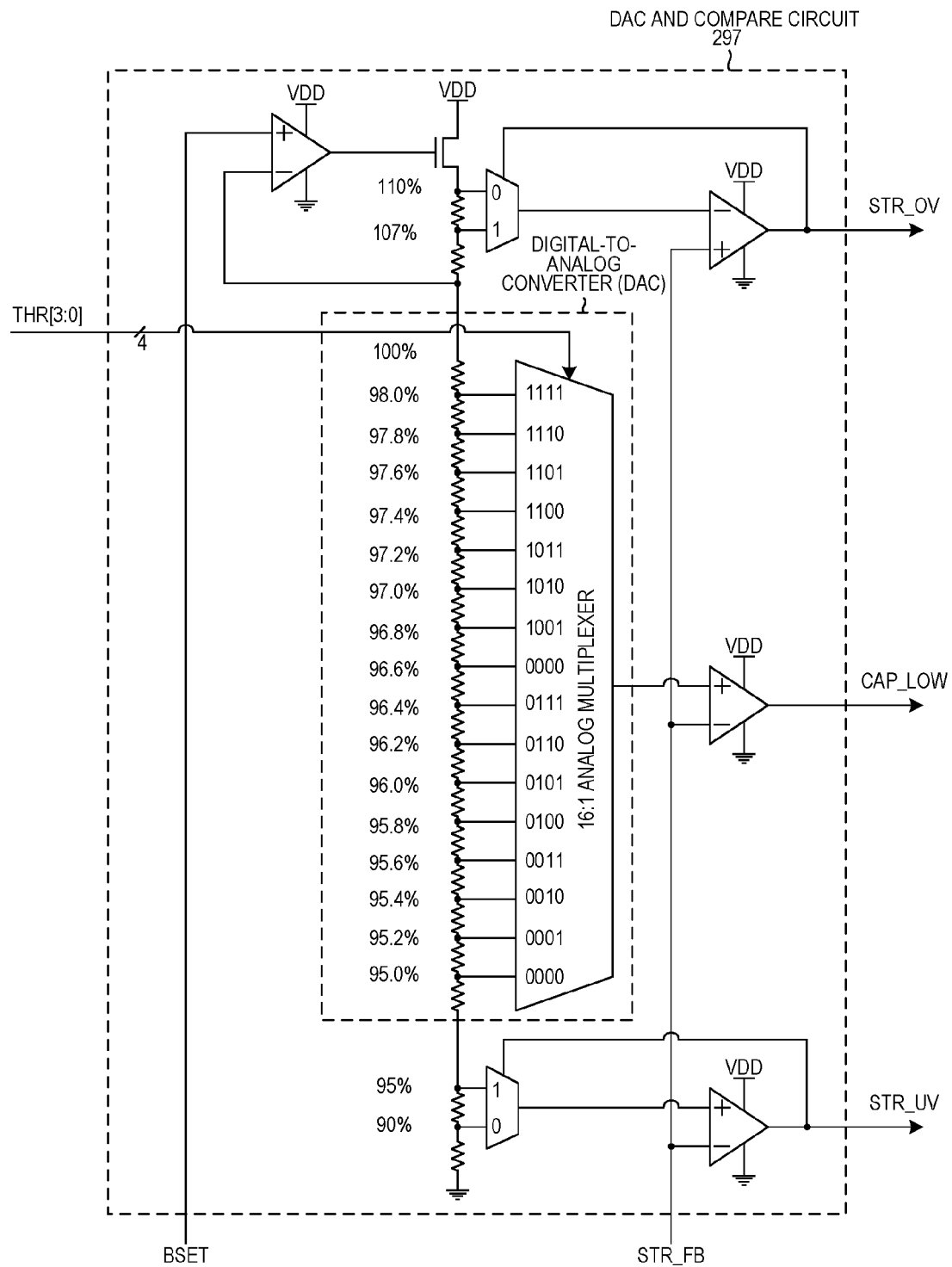
FIG. 11 is a more detailed diagram of the DAC and compare circuit of FIG. 8.

FIG. 11 is a more detailed diagram of the DAC and compare circuit 297 of FIG. 8.

Figure 12:
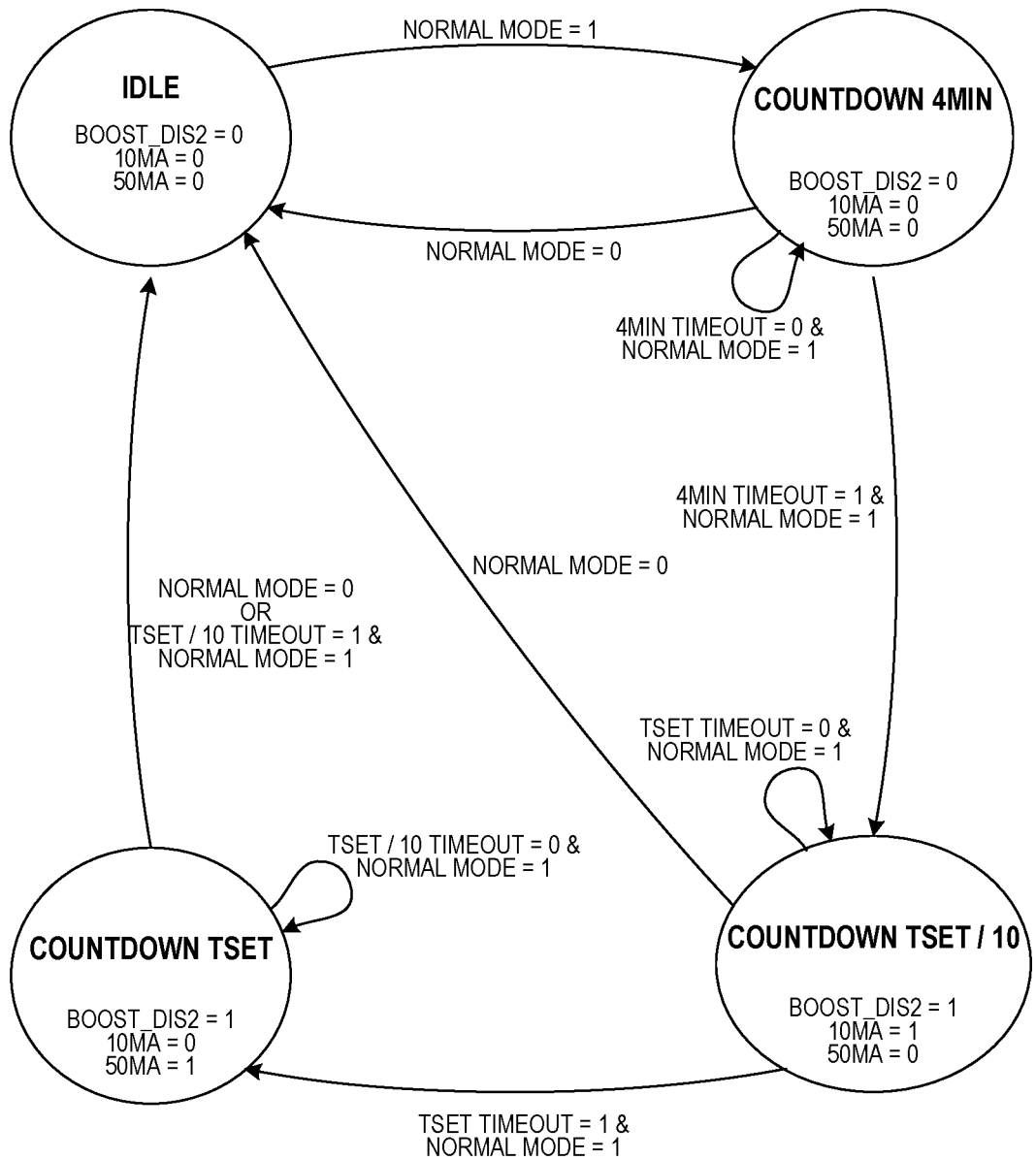
FIG. 12 is a state diagram that sets forth the operation of the capacitor health monitor state machine of the capacitor health check circuit.

FIG. 12 is a state diagram that sets forth the operation of the capacitor health monitor state machine 298 of the capacitor health check circuit 299 of the health monitor circuit 259 of FIG. 8.

Figures 13, 14:
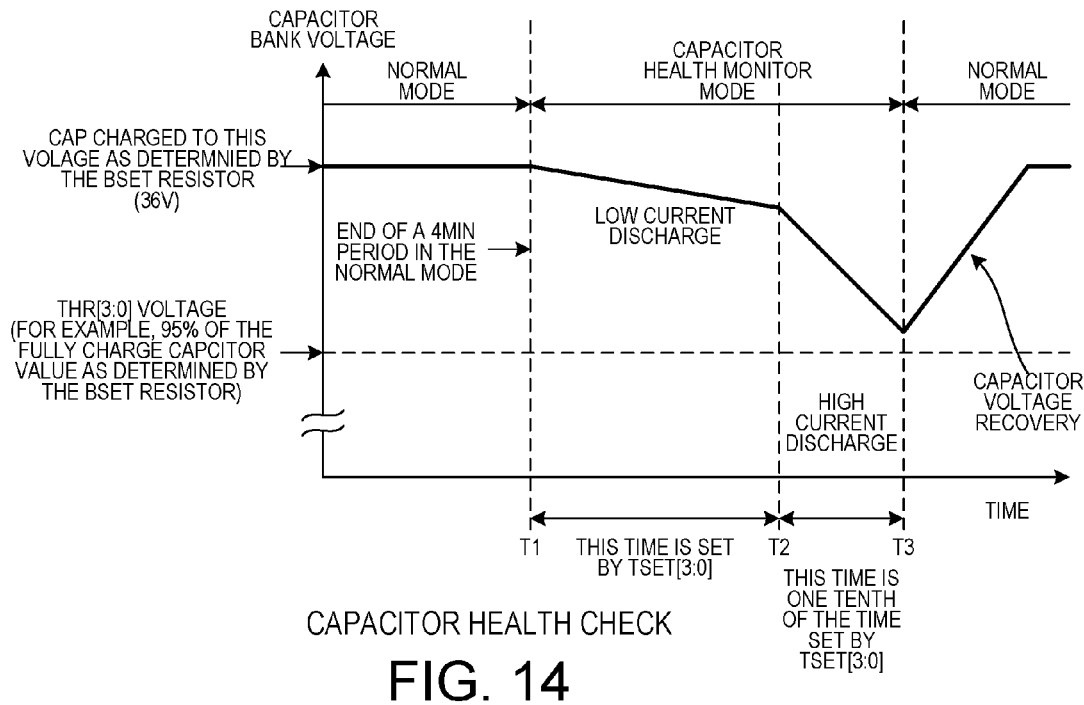
FIG. 13 is a table that indicates, for each 4-bit TSET[3:0] value, the corresponding time period throughout which the ten milliampere current sink is enabled.
FIG. 14 is a diagram that illustrates one capacitor health check operation as carried out by the capacitor health check circuit.

FIG. 13 is a table that indicates, for each 4-bit TSET[3:0] value, the corresponding time period throughout which the ten milliampere current sink is enabled.

FIG. 14 is a diagram that illustrates one capacitor health check operation as carried out by the capacitor health check circuit 299.

Figure 15:
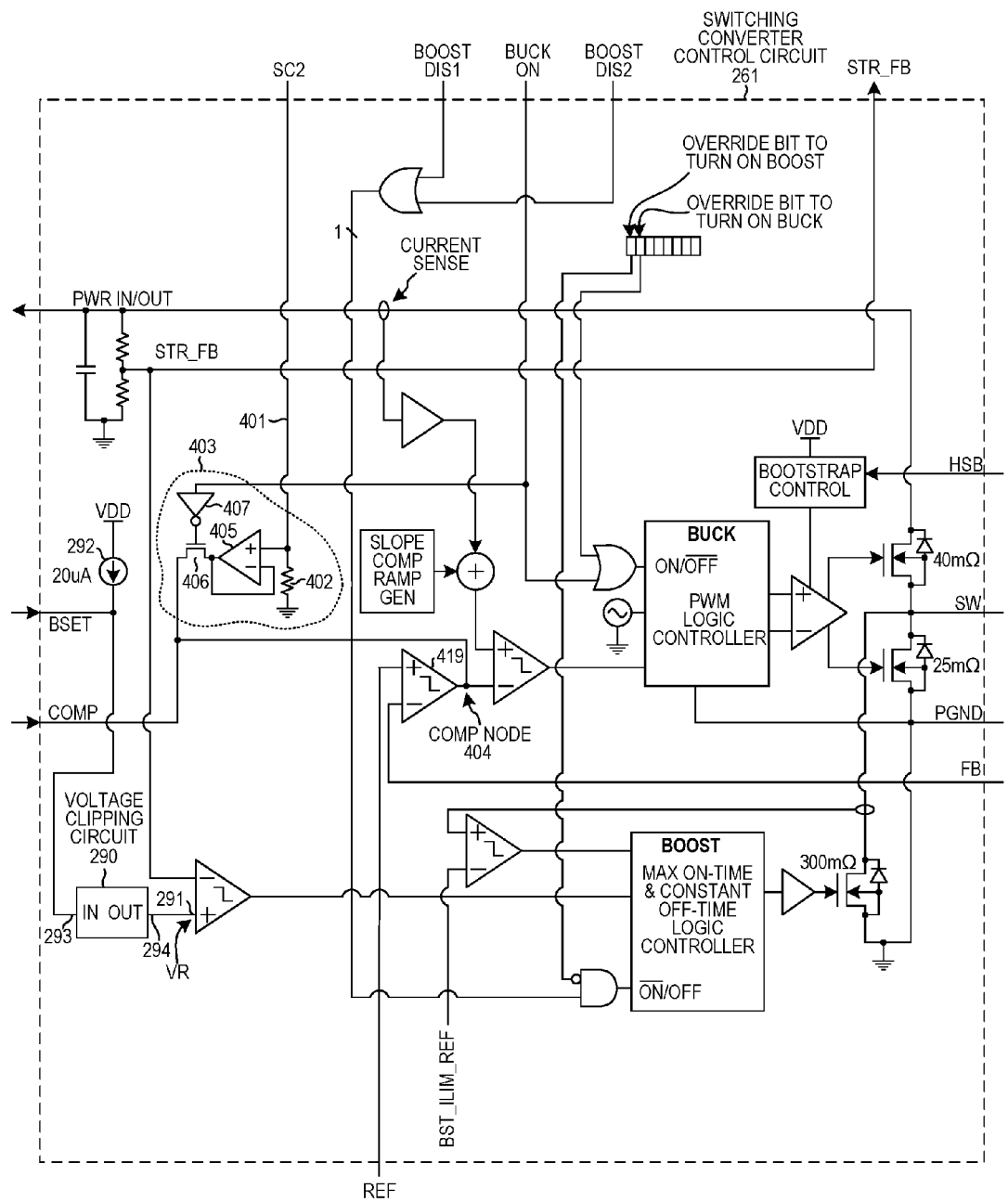
FIG. 15 is a diagram of the switching converter control circuit 261 of FIG. 6.

FIG. 15 is a diagram of the switching converter control circuit 261 of FIG. 6.

Figure 16:
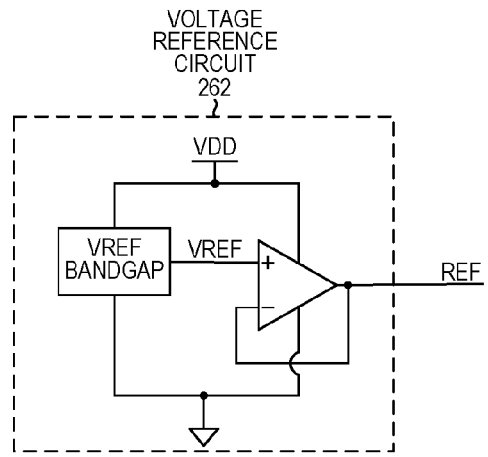
FIG. 16 is a more detailed diagram of the voltage reference circuit 262 of FIG. 6.

FIG. 16 is a more detailed diagram of the voltage reference circuit 262 of FIG. 6.

Figure 17:
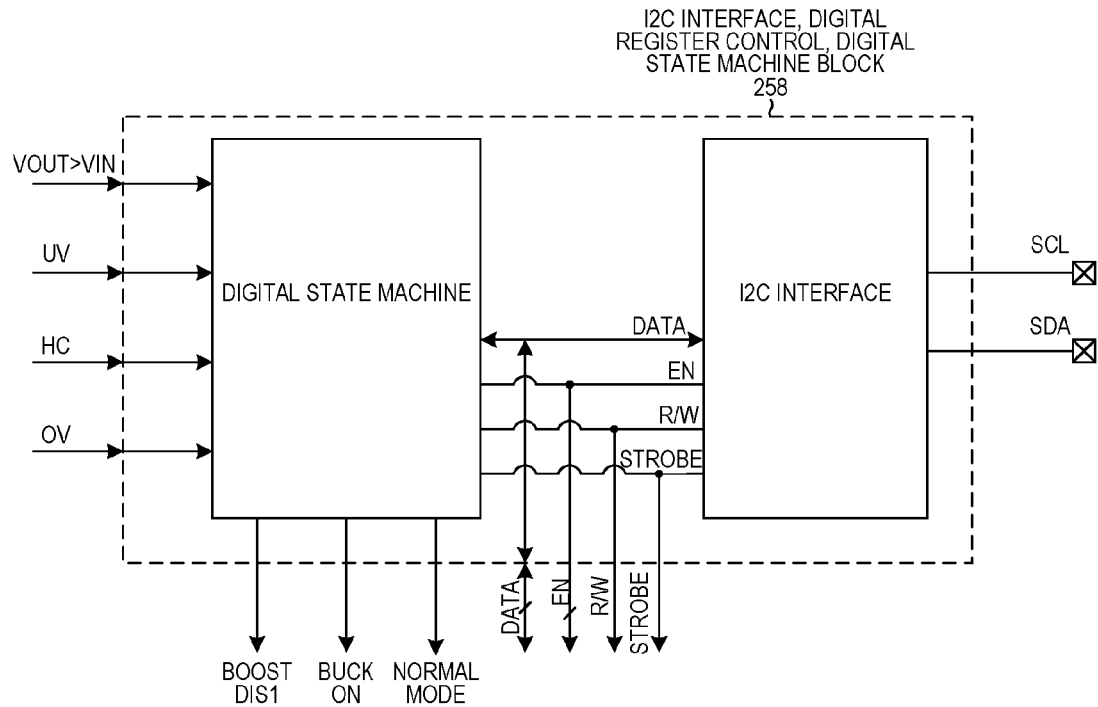
FIG. 17 is a block diagram of the I2C interface and digital register control and digital state machine circuit 258 of FIG. 6.

FIG. 17 is a block diagram of the I2C interface and digital register control and digital state machine circuit 258 of FIG. 6.

The magnitude of the relatively high voltage to which the converter boosts in the boost mode is user programmable, and is set by providing only one external resistor RBSET 219 of the appropriate resistance. Provided that the voltage on the voltage set input terminal BSET 245 is not below a first predetermined voltage V1 and is not above a second predetermined voltage V2, the magnitude of the resistance of this one RBSET resistor 219 corresponds directly to the magnitude of the relatively high voltage to which the STR terminal 244 is driven in the boost mode. The relatively high voltage to which the STR terminal 244 is driven in the boost mode is a gained-up version of the voltage on the BSET terminal 245. The voltage on the BSET terminal 245 is equal to the resistance of the RBSET resistor 219 multiplied by the twenty microampere current supplied by internal current source 292 of FIG. 15. Block 290 in FIG. 15 is a voltage clipping circuit similar to the voltage clipping circuit 58 of the embodiment of FIG. 2. If the voltage on the BSET terminal 245 is below the first predetermined voltage V1, then the voltage clipping circuit 290 outputs the first predetermined voltage V1 onto VR node 291. If the first predetermined voltage V1 is present on the VR node 291, then VOUT is set to be the VOUTMIN value. If the voltage on the BSET terminal 245 is above the second predetermined voltage V2, then the voltage clipping circuit 290 outputs the second predetermined voltage V2 onto VR node 291. If the second predetermined voltage V2 is present on the VR node 291, then VOUT is set to be the VOUTMAX value. If the voltage on the BSET terminal 245 is neither below V1 nor above V2, then the voltage clipping circuit 290 transfers the voltage on its IN input 293 to its OUT output 294 and onto the VR input and node 291 of the voltage regulator. The VR input and node 291 of FIG. 15 is similar to the VR input 61 of FIG. 2 in that it is a reference voltage input of a voltage regulator. In the case of the charging the capacitor bank 211, the output voltage terminal is the STR terminal 244 because this is the terminal onto which the voltage regulator is outputting the regulated DC output voltage (for example, 36 volts DC). As explained above, the voltage regulator in this case includes circuitry on the integrated circuit 206 as well as external components including inductor 224 L1.

Figure 18:
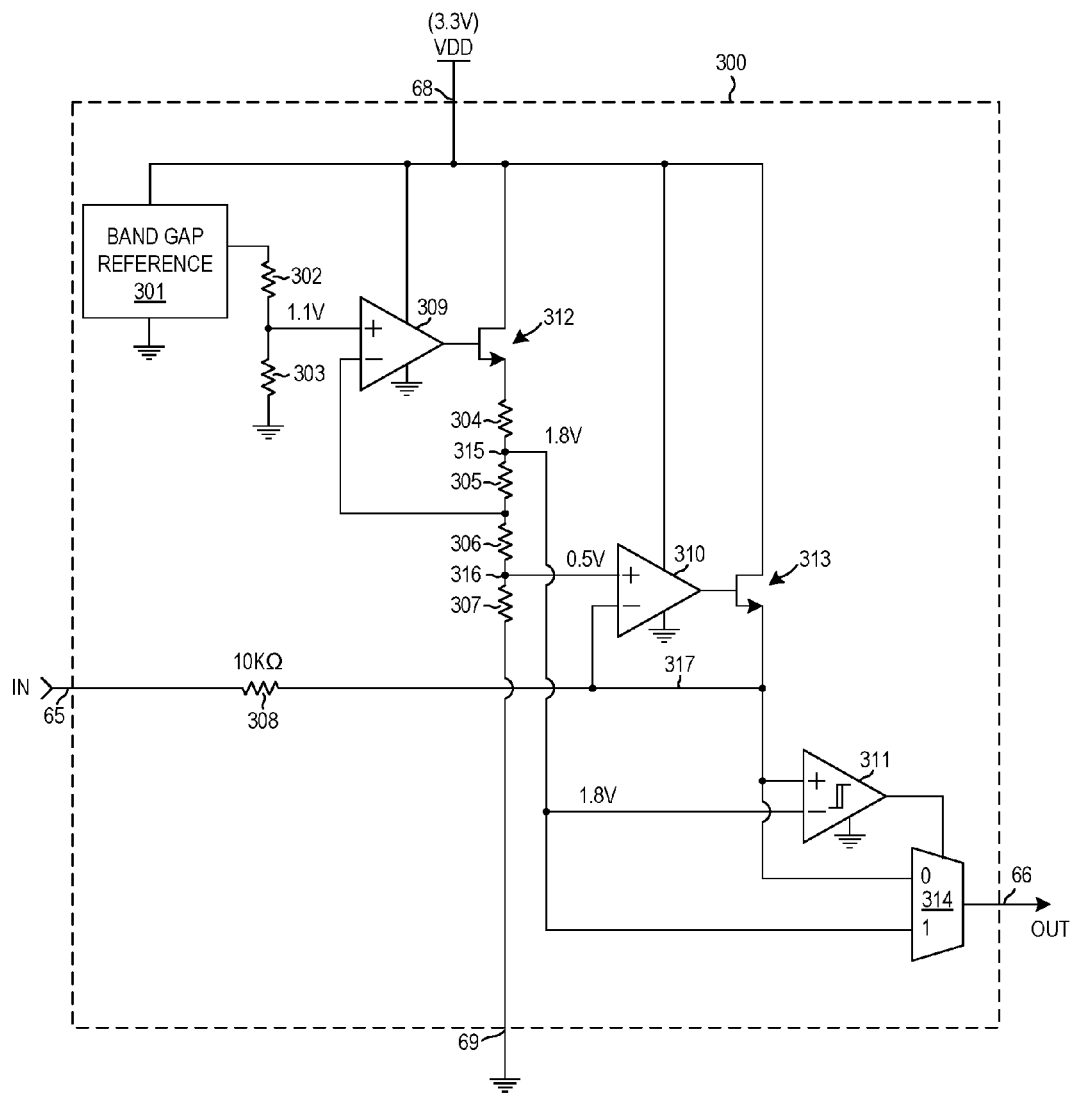
FIG. 18 is a circuit diagram of another example of the voltage clipping circuit of FIG. 2.

FIG. 18 is a circuit diagram of another example 300 of the voltage clipping circuit of FIG. 2. The circuit includes a bandgap reference 301, seven resistors 302-308, two differential amplifiers 309 and 310, a comparator 311, two N-channel transistors 312-313, and a 2:1 analog multiplexer 314. A bandgap voltage output by the bandgap reference circuit 301 is voltage-divided by a resistor voltage divider involving resistors 302 and 303 such that a stable 1.1 volt reference value is present on the non-inverting input of differential amplifier 309. The output lead of differential amplifier 309 is coupled to drive the gate of N-channel transistor 312. The resistor values of resistors 304-307 are selected such that a 1.8 volt reference voltage value is on node 315 and such that a 0.5 volt reference voltage value is on node 316.

If the voltage on the input node 65 is between 0.5 volts and 1.8 volts, then differential amplifier 310 keeps N-channel transistor 313 off. The input voltage is supplied onto the non-inverting input lead of the comparator 311. Comparator 311 compares the voltage on the input node 65 to the 1.8 volt reference voltage on the inverting input lead of comparator 311, and because the input voltage is less than 1.8 volts, the comparator 311 outputs a digital logic high signal, which causes analog multiplexer to couple the "1" input lead to the multiplexer's output lead. The input signal from the input node 65 is therefore communicated through the voltage clipping circuit 300 to the output node 66.

If, however, the input voltage on the input node 65 is lower than 0.5 volts, then differential amplifier 310 raises the voltage on its output lead until the N-channel transistor 313 is conductive enough that the voltage on node 317 rises and reaches 0.5 volts. The voltage on node 317 stabilizes and is held at 0.5 volts. Due to circuit connections, the 0.5 volt on node 317 is also present on the non-inverting input lead of comparator 311. Comparator 311 therefore outputs a digital logic low signal. The digital logic low signal is supplied onto the select input lead of the multiplexer 314, and this causes the multiplexer 314 to couple its "0" input lead to its output lead. Multiplexer 314 therefore outputs 0.5 volts onto its output lead and onto the OUT node 66.

If, however, the input voltage on the input node 65 is higher than 1.8 volts, then differential amplifier 310 keeps N-channel transistor 313 off. Comparator 311 compares the input voltage on its non-inverting input lead to the 1.8 volt reference voltage on its inverting input lead. Comparator 311 therefore outputs a digital logic high signal onto the select input lead of multiplexer 314. Multiplexer 314 therefore couples the "1" input lead to its output lead. Accordingly, the 1.8 volt reference voltage present on the "1" input lead of the multiplexer 314 is communicated through the multiplexer 314 and to the OUT output node 66.

The current sense signal SC2 is a sense current that is proportional to the current flow passing through the eFuse (through current switch circuit) 257 and out of the VOUT terminal 263 to the load. The load in this case is PMU 205 and the solid state drive system 204. This sense current signal SC2 is communicated from the current switch circuit 257 via conductor 401 to the switching converter control circuit 261. In the switching converter control circuit 261 the sense current signal SC2 is converted into a sense voltage signal by running the current signal through a resistor 402. A voltage buffer circuit 403 supplies a buffered version of this sense voltage onto the comp node 404 when buck mode operation of the switching converter is disabled. The comp node 404 is the node at the output of the feedback loop error amplifier 419 of the buck converter. The supplying of the buffered version of the sense voltage onto the comp node 404 serves to prebias the voltage on the comp node 404 to a voltage that is fairly close to the voltage that would otherwise be on the comp node 404 were the switching converter operating in the buck mode and supplying the same load. The sense current signal SC2 has a current magnitude that is proportional to the amount of output current TOUT that must be output from the VOUT terminal 263 to the load in order to maintain the desired regulated 3.3 volts at the load. Accordingly, if input power received onto the power loss protection integrated circuit 206 via power input connector terminals 212 and 213 were to be suddenly lost, then this same amount of output load current TOUT would then have to then be supplied to the load using the cap bank 211 as an energy source. Because the magnitude of the load does not typically change when input power (power received from AC-to-DC adapter 203) is lost in this way, the detected load current flowing through the eFuse 257 just prior to the loss of power as measured by the signal SC2 is usable to prebias the voltage on the comp node 404 within the buck converter circuit so that when the buck converter circuit is enabled upon the power loss condition the buck converter circuit will drive the same amount of load current onto the load that was driven just prior to the loss of power by the eFuse 257. This prebiasing of the voltage on the comp node 404 reduces the amount of time required for the control loop of the buck converter circuit to stabilize for its steady state operation in taking energy from the cap bank 211 (for example, at an initial 36 volts), and bucking this high voltage down to 3.3 volts, and driving the appropriate amount of current at the lower 3.3 volts out to the load. The voltage buffer circuit 403 that drives the prebias voltage onto the comp node 404 is disabled (so that it does not drive the comp node) by the BUCK ON signal received via BUCK ON input and conductor 269 during times when the switching converter is operating as a buck converter. Voltage buffer circuit 403 comprises the resistor 402, an operational amplifier 405 connected as a voltage follower, a N-channel transistor 406 operating as a switch, and an inverter 407. In other examples, the operational amplifier is coupled to have voltage gain. In other examples, the operational amplifier is coupled as a transconductance amplifier so that it outputs a current whose magnitude is proportional to the sense voltage dropped across resistor 402.

Figure 19:
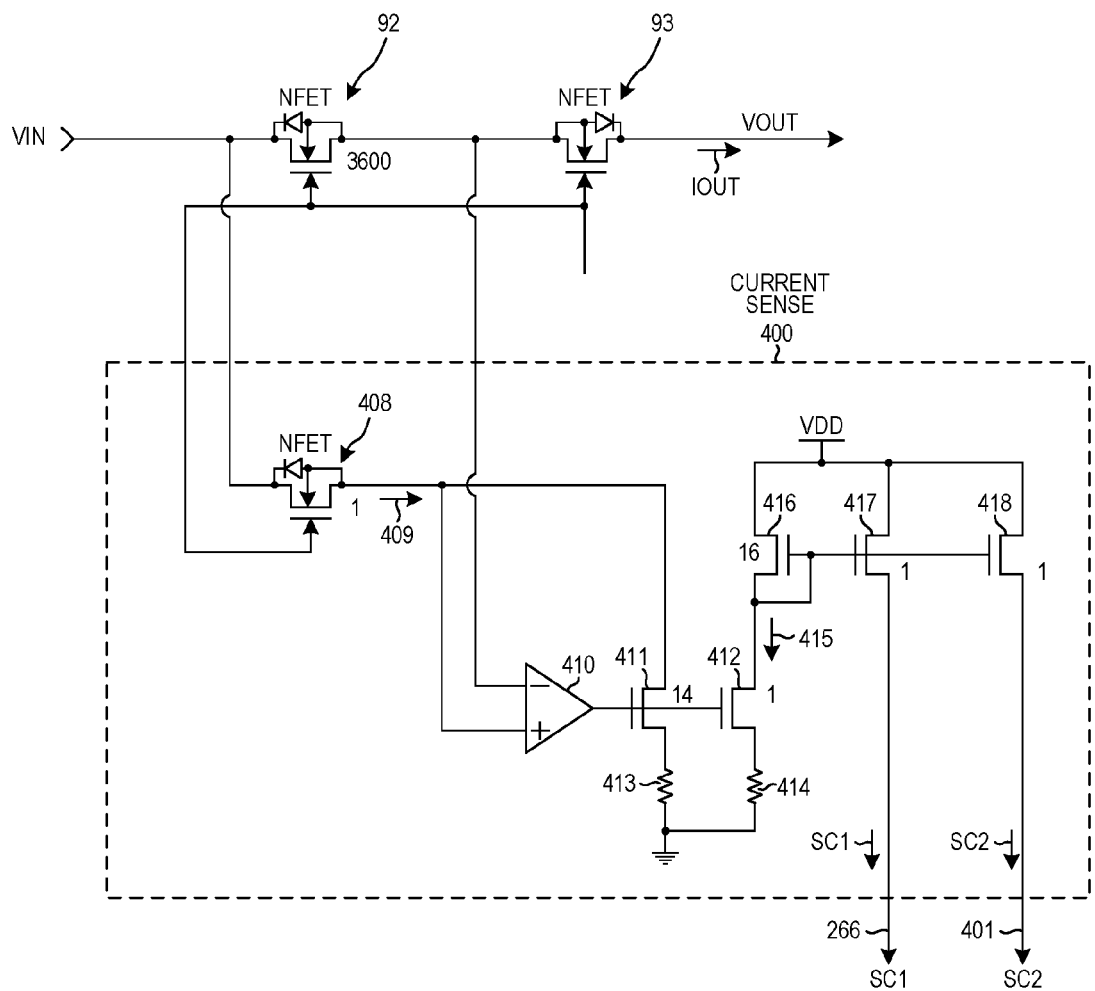
FIG. 19 is a more detailed diagram of one example of the current sense circuit 400 of FIG. 7.

FIG. 19 is a more detailed diagram of one example of the current sense circuit 400 of FIG. 7. Transistors 92 and 93 are the same transistors as shown in FIG. 7. Transistor 408 is connected as a current sense FET. The ratio of the transistor sizes of transistor 92 to transistor 408 is 3600:1. The operational amplifier 410 modulates the current 409 such that the positive and negative differential input terminals of the operational amplifier 410 are equal. This means that the source voltages of transistors 92 and 408 are equal, and they therefore carry ratiometric current. The small sense current 409 is in turn mirrored N-channel transistors 411 and 412 and resistors 413 and 414, into a current 415. This current 415 is in turn mirrored by P-channel transistors 416, 417 and 418. The current mirror ratios are such that the sense current SC2 varies by 1.25 microamperes per ampere of current TOUT.

Although certain specific embodiments are described above for instructional purposes, the teachings of this patent document have general applicability and are not limited to the specific embodiments described above. The voltage regulator circuit may have a positive voltage gain, or a negative voltage gain. In some cases, all of the voltage regulator circuit is disposed on the voltage regulator integrated circuit whereas in other cases only a part of the voltage regulator circuit is disposed on the voltage regulator integrated circuit. The voltage gain of the voltage regulator circuit may be user programmable such as by the selection of discrete components external an integrated circuit of which the voltage regulator circuit is a part or via information received onto that integrated circuit through an interface such as a serial bus. The method of using a voltage clipping circuit to receive a set voltage from a terminal, where the set voltage is set by an external resistor, is usable to set a parameter of an integrated circuit other than an output voltage. The method is therefore a general purpose method that is not limited to use in connection with voltage regulators or voltage regulator integrated circuits. The parameter being set can be an analog or variable value or setting. The parameter being set can also be a digital value or setting. The setting voltage on the terminal may be set by an external resistor as described above, or may alternatively be set by an external circuit that drives a set signal onto the terminal. Accordingly, various modifications, adaptations, and combinations of various features of the described embodiments can be practiced without departing from the scope of the invention as set forth in the claims.

What is claimed is:

1. An integrated circuit comprising:
   a current source;
   a voltage set input terminal, wherein the voltage set input terminal is coupled to the current source so that a current sourced from the current source can flow out of the integrated circuit via the voltage set input terminal;
   an output voltage terminal;
   a voltage regulator circuit having a reference voltage input and a regulator voltage output, wherein the regulator voltage output is coupled to the output voltage terminal; and
   a voltage clipping circuit having an input and an output, wherein the input of the voltage clipping circuit is coupled to the voltage set input terminal, wherein the output of the voltage clipping circuit is coupled to the reference voltage input of the voltage regulator circuit, wherein a voltage on the input of the voltage clipping circuit is supplied by the voltage clipping circuit onto the output of the voltage clipping circuit if the voltage on the input of the voltage clipping circuit is in a range between a first predetermined voltage V1 and a second predetermined voltage, wherein the voltage clipping circuit supplies the first predetermined voltage V1 onto the output of the voltage clipping circuit if the voltage on the input of the voltage clipping circuit is less than the first predetermined voltage V1, and wherein the voltage clipping circuit supplies the second predetermined voltage V2 onto the output of the voltage clipping circuit if the voltage on the input of the voltage clipping circuit is greater than the second predetermined voltage V2.

2. The integrated circuit of claim 1, wherein the voltage set input terminal and the input of the voltage clipping circuit are parts of a first node, wherein the output of the voltage clipping circuit and the reference voltage input of the voltage regulator circuit are parts of a second node, and wherein the regulator voltage output node and the output voltage terminal are parts of a third node.

3. The integrated circuit of claim 1, wherein the voltage regulator circuit has a positive voltage gain, and wherein the voltage regulator circuit outputs a regulated output voltage onto the regulator voltage output that is a positive multiple of a voltage on the reference voltage input of the voltage regulator circuit.

4. The integrated circuit of claim 3, wherein the voltage clipping circuit and the current source are both powered from a supply voltage received from a supply voltage conductor, and wherein the supply voltage is a smaller voltage than the regulator output voltage that is output by the voltage regulator circuit.

5. The integrated circuit of claim 3, wherein the voltage clipping circuit and the current source are both powered from a supply voltage received from a supply voltage conductor, and wherein the voltage regulator circuit can output an output voltage onto the output voltage terminal that is greater than the supply voltage.

6. The integrated circuit of claim 1, wherein the voltage regulator circuit has a negative voltage gain, and wherein the voltage regulator circuit outputs a regulated output voltage onto the regulator voltage output that is a negative multiple of a voltage on the reference voltage input of the voltage regulator circuit.

7. The integrated circuit of claim 1, wherein the voltage regulator circuit is taken from the group consisting of: a linear regulator, and a part of a linear regulator.

8. The integrated circuit of claim 1, wherein the voltage regulator circuit is taken from the group consisting of: a switched-mode power supply, and a part of a switched-mode power supply.

9. The integrated circuit of claim 1, wherein the current source is coupled to a supply voltage conductor, wherein the first predetermined voltage V1 is a voltage greater than zero volts, and wherein the second predetermined voltage V2 is a voltage smaller than a supply voltage on the supply voltage conductor.

10. An integrated circuit comprising:
    a current source;
    a voltage set input terminal, wherein the voltage set input terminal is coupled to the current source so that a current flowing through the current source can flow through the voltage set input terminal;
    a reference voltage input of a voltage regulator circuit;
    an output voltage terminal, wherein the voltage regulator circuit is coupled to drive an output voltage onto the output voltage terminal; and
    a voltage clipping circuit having an input and an output, wherein the input of the voltage clipping circuit is coupled to the voltage set input terminal, wherein the output of the voltage clipping circuit is coupled to the reference voltage input of the voltage regulator circuit, wherein a voltage on the input of the voltage clipping circuit is supplied by the voltage clipping circuit onto the output of the voltage clipping circuit if the voltage on the input of the voltage clipping circuit is in a range between a first predetermined voltage V1 and a second predetermined voltage, wherein the voltage clipping circuit supplies the first predetermined voltage V1 onto the output of the voltage clipping circuit if the voltage on the input of the voltage clipping circuit is less than the first predetermined voltage V1, and wherein the voltage clipping circuit supplies the second predetermined voltage V2 onto the output of the voltage clipping circuit if the voltage on the input of the voltage clipping circuit is greater than the second predetermined voltage V2.

11. The integrated circuit of claim 10, wherein the current source is coupled to a supply voltage conductor, wherein the first predetermined voltage V1 is a voltage greater than zero volts, and wherein the second predetermined voltage V2 is a voltage smaller than a supply voltage on the supply voltage conductor.

12. The integrated circuit of claim 10, wherein the voltage regulator circuit is taken from the group consisting of: a linear regulator, a switched-mode power supply, a part of a linear regulator, and a part of a switched-mode power supply.

13. The integrated circuit of claim 10, wherein the voltage regulator circuit is a linear regulator circuit that is entirely disposed on the integrated circuit.

14. An integrated circuit comprising:
a current source;
a voltage set input terminal, wherein the voltage set input terminal is coupled to the current source so that a current flowing through the current source can flow through the voltage set input terminal;
a reference voltage input of a voltage regulator circuit, wherein a magnitude of an output voltage output by the voltage regulator is set by a voltage on the reference voltage input; and
a voltage clipping circuit having an input and an output, wherein the input of the voltage clipping circuit is coupled to the voltage set input terminal, wherein the output of the voltage clipping circuit is coupled to the reference voltage input of the voltage regulator circuit, wherein a voltage on the input of the voltage clipping circuit is supplied by the voltage clipping circuit onto the output of the voltage clipping circuit if the voltage on the input of the voltage clipping circuit is in a range between a first predetermined voltage V1 and a second predetermined voltage, wherein the voltage clipping circuit supplies the first predetermined voltage V1 onto the output of the voltage clipping circuit if the voltage on the input of the voltage clipping circuit is less than the first predetermined voltage V1, and wherein the voltage clipping circuit supplies the second predetermined voltage V2 onto the output of the voltage clipping circuit if the voltage on the input of the voltage clipping circuit is greater than the second predetermined voltage V2.

15. The integrated circuit of claim 14, wherein the voltage clipping circuit is powered from a supply voltage received from a supply voltage conductor, wherein the supply voltage conductor is a conductor of the integrated circuit, and wherein the output voltage output by the voltage regulator circuit can be set to be greater than the supply voltage.

16. The integrated circuit of claim 14, wherein the voltage clipping circuit is powered from a supply voltage received from a supply voltage conductor, wherein the supply voltage conductor is a conductor of the integrated circuit, and wherein the output voltage output by the voltage regulator circuit is so large that it would damage the voltage clipping circuit if the output voltage were present on the supply voltage conductor.

17. The integrated circuit of claim 14, wherein the reference voltage input is an input lead of a differential amplifier.

18. The integrated circuit of claim 14, wherein the current source sources current that flows out of the integrated circuit via the voltage set input terminal.

19. The integrated circuit of claim 14, wherein the current source sinks current that flows into the integrated circuit via the voltage set input terminal.

20. The integrated circuit of claim 14, wherein the output of the voltage clipping circuit and the reference voltage input of the voltage regulator circuit are parts of the same node.

21. An integrated circuit comprising:
a current source;
a voltage set input terminal wherein the voltage set input terminal is coupled to the current source so that a current flowing through the current source can flow through the voltage set input terminal; and
a voltage regulator, wherein: 1) if an input voltage VIN on the voltage set input terminal is between a first predetermined voltage V1 and a second predetermined voltage V2 then the voltage regulator outputs an output voltage VOUT onto an output node such that VOUT has a magnitude that varies as a function of VIN, 2) if VIN is lower than the first predetermined voltage V1 then the voltage regulator outputs the output voltage VOUT onto the output node such that VOUT has a magnitude equal to VOUTMIN, and 3) if VIN is greater than the second predetermined voltage V2 then the voltage regulator outputs the output voltage VOUT onto the output node such that VOUT has a magnitude equal to VOUTMAX, wherein the voltage regulator is powered at least in part by a supply voltage VDD present between a ground conductor of the voltage regulator and a supply voltage conductor of the voltage regulator, wherein a ground voltage GND is present on the ground conductor, and wherein GND<V1<V2<VDD.

22. The integrated circuit of claim 21, wherein VOUTMAX is greater than VDD.

23. The integrated circuit of claim 21, wherein VOUTMAX is smaller than V2.

24. The integrated circuit of claim 21, wherein the voltage regulator has a user programmable voltage gain.

* * * * *